(12) United States Patent
Doynov et al.

(10) Patent No.: US 11,451,051 B2
(45) Date of Patent: Sep. 20, 2022

(54) METHOD AND SYSTEMS FOR SUPPRESSING ELECTROMAGNETIC PULSE INDUCED SURGES USING COMBINED MULTIPORT PROTECTION WITH IMPEDANCE MATCHING AND LOW INSERTION LOSS

(71) Applicants: Plamen Doynov, Kansas City, MO (US); Timothy A Carty, Waverly, KS (US)

(72) Inventors: Plamen Doynov, Kansas City, MO (US); Timothy A Carty, Waverly, KS (US)

( * ) Notice: Subject to any disclaimer, the term of this patent is extended or adjusted under 35 U.S.C. 154(b) by 0 days.

(21) Appl. No.: 17/521,369

(22) Filed: Nov. 8, 2021

(65) Prior Publication Data

US 2022/0224108 A1    Jul. 14, 2022

Related U.S. Application Data

(63) Continuation of application No. 17/148,168, filed on Jan. 13, 2021, now Pat. No. 11,171,483.

(51) Int. Cl.
*H02H 3/08* (2006.01)
*H02H 9/04* (2006.01)
*H02H 5/00* (2006.01)
*H02H 3/10* (2006.01)
*H02H 3/22* (2006.01)

(52) U.S. Cl.
CPC .............. *H02H 9/045* (2013.01); *H02H 5/00* (2013.01); *H02H 5/005* (2013.01); *H02H 9/04* (2013.01); *H02H 3/08* (2013.01); *H02H 3/105* (2013.01); *H02H 3/22* (2013.01); *H02H 9/041* (2013.01); *H02H 9/046* (2013.01)

(58) Field of Classification Search
CPC ............ H02H 9/04; H02H 5/00; H02H 9/045; H02H 5/005; H02H 3/22; H02H 9/041; H02H 1/04; H02H 3/023; H02H 3/08; H02H 3/105; H02H 3/16; H02H 7/26; H02H 9/005; H02H 9/00; H02H 9/046; H02J 3/1821
USPC ........................................ 361/91.1, 117–119
See application file for complete search history.

(56) References Cited

U.S. PATENT DOCUMENTS

| 4,630,163 A | * | 12/1986 | Cooper | .................. | H02H 9/005 361/111 |
| 2008/0130185 A1 | * | 6/2008 | Masghati | ............... | H02H 9/046 361/119 |

(Continued)

*Primary Examiner* — Danny Nguyen
(74) *Attorney, Agent, or Firm* — Dale J. Ream

(57) ABSTRACT

A system and method for suppressing EMP-induced voltage surges due to detonation of a nuclear weapon at high altitude generating an EMP (HEMP) comprising E1, E2, and E3 component pulses. A plurality of shunting assemblies, each including transient voltage suppressors (TVSs), metal oxide varistors (MOVs), gas discharge tubes (GDTs), other mechanical, electrical and ionization discharge devices (IDDs) and combinations thereof of surge limiting technologies, are positioned intermediate a signal stream and a plurality of electronic device ports associated with a plurality of communication channels for sensing upstream of the communication channels an overvoltage associated with each of the E1, E2, and E3 components of the EMP and shunting the over-voltages to predetermined allowable levels within the predetermined time.

30 Claims, 14 Drawing Sheets

(56) References Cited

U.S. PATENT DOCUMENTS

2010/0005320 A1* 1/2010 Squillante .............. H04L 12/10
713/300
2012/0262832 A1* 10/2012 Adomaitis ........... H05K 9/0067
361/119

* cited by examiner

Early time HEMP (E1)

$$E_1(t) = \begin{cases} 0 & \text{when } t \leq 0 \\ E_{01} \cdot k_1 \left(e^{-a_1 t} - e^{-b_1 t}\right) & \text{when } t > 0 \end{cases}$$

$E_{01} = 50\,000$ V/m
$a_1 = 4 \cdot 10^7$ s$^{-1}$
$b_1 = 6 \cdot 10^8$ s$^{-1}$
$k_1 = 1.3$

Intermediate time HEMP (E2)

$$E_2(t) = \begin{cases} 0 & \text{when } t \leq 0 \\ E_{02} \cdot k_2 \left(e^{-a_2 t} - e^{-b_2 t}\right) & \text{when } t > 0 \end{cases}$$

$E_{02} = 100$ V/m
$a_2 = 1000$ s$^{-1}$
$b_2 = 6 \cdot 10^7$ s$^{-1}$
$k_2 = 1$

Late time HEMP (E3)

$$E_i(t) = \begin{cases} 0 & \text{when } \tau \leq 0 \\ E_{0i} \cdot k_i \left(e^{-a_i \tau} - e^{-b_i \tau}\right) & \text{when } \tau > 0 \end{cases}$$

$\tau = t - 1$
$E_{0i} = 0.04$ V/m
$a_i = 0.02$ s$^{-1}$
$b_i = 2$ s$^{-1}$
$k_i = 1.056$ $$E_j(t) = \begin{cases} 0 & \text{when } \tau \leq 0 \\ E_{0j} \cdot k_j \left(e^{-a_j \tau} - e^{-b_j \tau}\right) & \text{when } \tau > 0 \end{cases}$$

$\tau = t - 1$
$E_{0j} = 0.0333$ V/m
$a_j = 0.015$ s$^{-1}$
$b_j = 0.02$ s$^{-1}$
$k_j = 9.481$ $E3(t) = E_i(t) + E_j(t)$

FIG. 6

| Standard Parameter | Bell Labs (1960s) DEXP | IEC-77C (1993) DEXP | Leuthauser (1994) QEXP | VG95371-10 (1995) DEXP | IEC 61000-2-9 (1996) DEXP |
|---|---|---|---|---|---|
| t10%-90% | 4.6 ns | 2.5 ns | 1.9 ns | 0.9 ns | 2.5 ns |
| Peak Field $E_o$ | 50 kV/m | 50 kV/m | 60 kV/m | 65 kV/m | 50 kV/m |
| FWHM | 18.4 ns | 23 ns | 23.8 ns | 24.1 ns | 23 ns |
| constant | 1.05 | 1.3 | 1.08 | 1.085 | 1.3 |
| α (1/sec) | 4x10$^6$ | 4x10$^7$ | 2:20x10$^9$ | 3:22x10$^7$ | 4x10$^7$ |
| β (1/sec) | 4:76x10$^8$ | 6x10$^8$ | 3:24x10$^7$ | 2:07x10$^9$ | 6x10$^8$ |
| Energy Density | 0.891 J/m$^2$ | 0.114 J/m$^2$ | 0.167 J/m$^2$ | 0.196 J/m$^2$ | 0.114 J/m$^2$ |

FIG. 7

| IEC E1 HEMP Waveform Properties ||
|---|---|
| Characteristic | Value |
| Waveform peak | $E_{peak} = 50,000 \text{ V/m}$ |
| Spectrum peak | $E_{low\,freq} = 0.00152 \text{ V/m/Hz}$ |
| Waveform peak power | $P_{peak} = 6.64 \times 10^6 \text{ W/m}^2$ |
| Spectrum peak power | $P_{low\,freq} = 6.11 \times 10^{-9} \text{ W/m}^2/\text{Hz}$ |
| Total energy | $W_{total} = 0.115 \text{ J/m}^2$ |
| Time of peak | $t_{peak} = 4.84 \text{ ns}$ |
| Rise time, 10% to 90% of peak | $t_{10-90} = 2.47 \text{ ns}$ |
| Pulse width, full width at half maximum | $FWHM = 23.0 \text{ ns}$ |
| Pulse width, total energy over peak power | $W_{total}/P_{peak} = 17.3 \text{ ns}$ |
| Spectrum width, total energy over peak spectrum power | $W_{total}/P_{low\,freq} = 18.8 \text{ MHz}$ |

FIG. 8

METHOD AND SYSTEMS FOR SUPPRESSING ELECTROMAGNETIC PULSE INDUCED SURGES USING COMBINED MULTIPORT PROTECTION WITH IMPEDANCE MATCHING AND LOW INSERTION LOSS

REFERENCE TO RELATED APPLICATIONS

This application claims the priority of non-provisional patent application Ser. No. 17/148,168 filed on Jan. 13, 2021 titled System and Method for Detecting and Isolating an Electromagnetic Pulse for Protection of a Monitored Infrastructure (DIME II—AI Engine), which claims the priority of non-provisional patent application Ser. No. 16/925,600 filed Jul. 10, 2020 (now U.S. Pat. No. 10,938,204), titled Method for Detecting an Isolating an Electromagnetic Pulse for Protection of a Monitored Infrastructure, which claims the priority of non-provisional patent application Ser. No. 16/597,427 filed Oct. 9, 2019, (now U.S. Pat. No. 10,742,025), titled System and Method for Detecting an Isolating an Electromagnetic Pulse for Protection of a Monitored Infrastructure, which claims the priority of non-provisional patent application Ser. No. 16/240,897 filed Jan. 7, 2019 (now U.S. Pat. No. 10,530,151), titled System and Method For Suppressing Electromagnetic Pulse-Induced Electrical System Surges, which claims the benefit of provisional patent application U.S. Ser. No. 62/615,159 filed Jan. 9, 2018 titled System and Method For Suppressing Electromagnetic Pulse-Induced Electrical System Surges, all of which are incorporated in their entirety herein by reference.

BACKGROUND OF THE INVENTION

This invention relates generally to persistent monitoring, detecting, and classifying an electromagnetic pulse (EMP) and isolating the impending effects of said pulse to prevent damage to an infrastructure such as an electrical grid or its components for generating, transmitting, distributing, and using of electrical power at commercial facility, or the like as shown in FIG. 1.

An electromagnetic pulse, also sometimes called a transient electromagnetic disturbance, is a short burst of electromagnetic energy. The waveform of EM pulse in time domain describes how the amplitude of the ultrashort pulse changes over the time and correlates to the intensity of the EMP. The real pulses tend to be quite complicated, so their simplified descriptions are typically characterized by:

The type of energy—radiated with different polarization, conducted, electric, magnetic, etc.

Pulse waveform: shape (rise and fall time), pulse width at half maximum (PWHM), duration, and peak amplitude The range or spectrum of frequencies present and the power spectrum distribution.

Any EMP is associated with electromagnetic interference (EMI) which is classified based on the frequency content of their spectral densities as "narrowband", "wideband" and "ultrawideband" distributed in different frequency ranges. The frequency spectrum and the pulse waveform in time domain are interrelated analytically via the Fourier transform and other mathematical transformations for joint time-frequency representation (wavelets, spectrograms, etc.). An EMP typically contains energy at many frequencies from direct current (DC) to some upper limit depending on the source. Withing the bandwidth there could be multiple spectral peaks with high magnitudes. In general, the shorter the pulse (which also implies a short rise time) the broader the spread over a range of frequencies. The commonly used first-order approximation is $f_h = 0.35/\tau_r$, where $f_h$ is the high frequency range (Hz) and $\tau_r$ is the rise time of the pulse (sec) from 10% to 90% of its peak amplitude.

An electromagnetic pulse, or EMP, can be generally characterized as a short duration burst of electromagnetic radiation generated by either natural events or man-made activities. Some examples include natural Solar wind, Solar flares, or Coronal Mass Ejection (CME), which produce Geomagnetic Disturbance (GMD). Man produced examples include EMP associated with nuclear blast and Directed Energy Weapons (DEW) which are also known as Intentional Electromagnetic Interference (IEMI). In this document, the term "EMP" is used to describe also the electromagnetic fields generated in association with the detonation of a nuclear weapon at high altitude as illustrated in FIG. 2. Without loss of generality, FIG. 2 is a pictograph of an electromagnetic pulse generation by high-altitude nuclear blast. Please note that FIGS. 2 to 14 are included to supplement the description of the physical phenomena, their modeling, and design approaches for the protection of broadband communication channels. FIGS. 15 to 19 are directly pertinent to a preferred embodiment example of the present invention. In general, the interactions of the high-energy gamma rays with atoms in the atmosphere produce electrons which interact with the Geo-magnetic field producing EM field with a Poynting vector from the burst source towards the Earth's surface. The field generated by a high-altitude EMP (HEMP) has direction variation along a north-south central line and over the horizon extended effects, as illustrated in FIG. 3, which is a pictograph of HEMP and the Electromagnetic Field (EMF) Poynting vector direction with respect to the observer's location. Frequently, the term High-altitude Nuclear EMP (HNEMP) is also used. The commonality is the high-altitude detonation which provides the formation of the EMP with high intensity. The intensity of the pulse varies by location (latitude) due to the Geo-magnetic field distribution. Some additional relevant factors will be discussed further while the detail specifics of the related physical phenomena are beyond the scope of this application.

The terms "EMP" or "HEMP" as used herein refer to the electromagnetic pulse generated by a weapon such as a nuclear blast (HEMP), directed energy system for high-power microwave (HPM) generation, other devices for IEMI or natural EMP events such as Coronal Mass Ejection (CME), supernova explosion, and other cosmic phenomenon resulting in Geomagnetic Disturbance (GMD) and large scale EMP effects.

An EMP event is capable of inducing voltages and corresponding currents into different electrical systems and depends on the coupling of the EM field with the system (its susceptibility) and the characteristics of the EM wave (direction, polarization, frequency content, and others). as the exposed transmission lines of wide-area power distribution grids, as well as the electrical systems of localized mini-grids, renewable energy systems, communication lines, homes' wiring, commercial buildings, and even vehicle electrical systems. FIG. 4 illustrates the coupling of the EM energy into a transmission line at height h above the ground. The image displays a few key relations of the Electric field (E) and Magnetic field (B) using the Half-space Earth model. The image is from "The Early-time (E1) HEMP and its impact on the US Power Grid" report, written in 2010 by Savage et al, Metatech Corp., and provides an excellent analysis of the physical phenomena associated with the HEMP.

Unless monitored, detected, isolated, or suppressed, that unwanted induced current and over-voltage surges can damage or destroy components within the electrical systems in the area of impact, diminishing the operability of the electrical system or oftentimes rendering it unusable until repaired. Timely and successful protection is possible only with a persistent monitoring and rapid detection of what is known in the literature as the E1 HEMP. As seen in FIG. 2, due to its origin, a HEMP will induce effects in a very large area. Similarly, it is understood that a massive solar ejection (CME) reaching the Earth imposes GMD which have damaging effects on electrical infrastructure. CME from the Sun is an eruption of super-hot plasma that spews charged particles across the Solar system. Additional Solar space weather also may cause disturbances of the Geomagnetic field and induce over-currents in the electrical grid resulting in overheating and damaging of high-voltage transformers, and failure of components within the electrical grid.

Unlike the electromagnetic radiation or pulse associated with common natural phenomena (lighting strikes, transmission lines overvoltage, and overcurrent surges, etc.), the HEMP comprises of more complex time and frequency domain characteristics. Historically, the HEMP is described with several stages in time following the nuclear blast. They are also known as HEMP phases or pulses of varying waveform (magnitude, duration, frequency content, etc.). Therefore, the HEMP is more accurately considered as a complex, electromagnetic multi-pulse event, usually described in terms of sequence of three primary components defined by the International Electrotechnical Commission (IEC) as E1, E2, and E3 phases of the high-altitude EMP (HEMP). The characteristics of these phases (pulses) of HEMP are further described in this application. The relative electric field strength of the time sequence is displayed in FIG. 5A and FIG. 5B using logarithmic scales for E (V/m) vs Time (s). Some of the commonly used analytical expressions for the HEMP E1, E2, and E3 waveforms are given in FIG. 6, which presents the analytical expressions for the waveforms.

Starting in the 1960s, multiple waveform descriptions have been developed in order to model the associated hazardous effects. A series of standards related to the description of the associated waveforms and known as IEC 77C Standards. The evolution of the unclassified standards with respect to the E1 HEMP environment can be seen in the Table in FIG. 7, which displays the evolution of the waveform parameters of the unclassified E1 HEMP environment Standards. Some additional details of the associated pulse waveform characteristics are given in the Table in FIG. 8. As can be seen from the Table in FIGS. 9A to 9C, the most common analytical expressions for Early time E1 HEMP are the Difference of double exponential (DEXP) and the Quotient of exponentials (QEXP). The plots of DEXP and QEXP in time domain and their respective spectral distribution in frequency domain are presented in FIG. 9A. Additional analytical expressions have been developed to. This is beyond the scope of this description. FIG. 9B displays the waveform for the Intermediate time HEMP E2. FIG. 9C displays the two waveforms E3a and E3b associated with the Late time HEMP E3 which has two wave components based on two different physical phenomena.

The damage to electrical and electronic devices is determined by the amount of energy that is transferred to devices in the electromagnetic environment and all electrical or electronic equipment is susceptible to the malfunctions and permanent damage under the electromagnetic radiation of sufficient intensity. The plots in FIG. 10 illustrate the power spectrum density (V/m-Hz) associated with a HEMP E1, an atmospheric lightning, and IEMI (high-power microwave, high-intensity RF).

The level of system vulnerability is dependent on the intensity of the EMF and the coupling of the external fields to the electrical circuits and the sensitivity characteristics of circuits components. A temporary malfunction (or upset) can occur when an electromagnetic field induces current(s) and voltage(s) in the operating system electronic circuits at levels that are comparable to the normal operational rating characteristics. No matter what kind of the source is used, or which power/frequency/mode is applied, two principal coupling modes are recognized in the literature and the relevant standards assessing how much radiated power is coupled into target systems: (1) "Front Door" Coupling, (FDC), and (2) "Back Door" Coupling, (BDC). The FDC is typically observed when the power radiated from the RF/HPM source is directly coupled into the electronic systems. The antenna subsystem is designed to receive and transmit RF signals, and thus providing an efficient path for the energy flow from the electromagnetic source to enter the equipment and cause damage especially when the antenna's bandwidth is withing the frequency range of the RF/HPM source. As seen in FIG. 10, the HEMP E1 has a very broad bandwidth from DC to above 400 MHz The Intermediate time HEMP E2 has frequency content comparable with the EM spectrum of lightning strikes. The Late time HEMP E3 has very low frequency (long waves) waveforms.

The BDC occurs when the electromagnetic field from the source produces large transient voltage/currents or the EM waves propagate and couple through the gaps, small apertures, fixed electrical wiring and interconnecting cables, connections to the power mains, communication cables, network and telephone copper wires, unshielded sections, and others. The BDC can generally be described as a wide-range interference at specific narrow-band susceptibility characteristics because of existing apertures and modes of coupling to cables.

Since the impinging EMP field has a broad frequency spectrum and a high field strength, the antenna response must be considered both in and out of the antenna's band. The inadvertent, unintended, or parasitic antennae are electrically penetrating conducting structures, power lines, communication cables, and others that collect EMP energy and allow its entry into a building, a device, or an enclosure. The electrical wires of the grid can be considered as a BDC pathway, but also as imperfect antennae connected to the upstream and downstream components of the grid and are susceptible to broadband frequencies, including the lower frequency (long wavelength) coupling due to the long length of the power transmission lines. Additional factors influence the level of coupling and interference: wave polarization, geolocation, ground surface conductivity, height of the wires above ground, and others. With their long length, the electrical transmission lines are especially susceptible to the E3 HEMP, as further described below. The internal wiring of building, including data and communication centers, are also susceptible to EMF and would couple directly to the radiated field if the building is without a proper shielding.

Protection from radiated coupling of EM field is achieved by shielding of equipment with a conductive enclosure. In some cases, the whole building can be a shielding structure commonly known as a Faraday cage. Because input and output cables for power and communications must be present, special methods are employed to lower and limit the propagation of the induced transients via these wired connections and their conduit openings.

As described in the referenced related prior patents, one possible way to mitigate the effects of EMP is to detect in real time the occurrence of an event and disconnect the protected systems by isolating them physically from long cables, wires, antennas, etc. Specifically, to protect from the damaging effects of EMP, the environment must be persistently monitored with applicable sensors and when an EMP is detected, the appropriate isolation systems must be triggered to provide protection for the infrastructure. This is not an easy task given the high speed of the events and has been address in the referenced relevant patents. Methods and systems to implement the isolation have been described in the referenced related applications.

Additional protection method is to equip the electrical and electronic systems with means that prevent the excessive magnitude of voltage and current and absorb and redirect the energy of the EMP. Generally, these devices are known as surge suppressors and arrestors. Most commercially available surge suppressing devices are design and built to offer protection to lightning with micro-seconds response times. This response time is not sufficient for protection from the nano-second rise time of HEMP E1 and IEMI waveforms. The referenced related applications provide solutions for mitigation of the E1, E2, and E3 components of an EMP. FIG. 11 displays the response time and the voltage limiting of surge protection design for mitigation of HEMP effects. It is important to notice that most commercially available surge arrestors are predominantly oriented to electrical power systems operating at extremely low frequencies (ea. 60 Hz of the US electrical grid). These systems are not substantially affected by the insertion of a protection systems described in the referenced related applications and other protection systems described in the literature. The protective circuits do not influence the normal operation of the system.

This is not the case for data communication systems with physical channels operating at high speed (wide bandwidth). The incorporated protective means result in insertion loss and channel capacity degradation predominantly based on the impedance mismatch and the resulting signal reflections. For example, the addition of an in-line surge protector introduces two more port connections and a cable (regardless how short it is). In general, the parasitic capacitance of the protective components introduces an equivalent lump-element change of the characteristic impedance of the channel. In a digital channel, the capacitance is charged/discharged every time the logical level signal changes. This results in degrading the bandwidth of the channel. For example, a channel with 1 Gbps bandwidth degrades to 100 Mbps transmission rates.

The "physical layer" is the first Layer (or the PHY layer) of the Open Systems Interconnection reference model, also known as the OSI Model or the Seven Layer Model. The physical layer is the bottom layer of the seven-layer OSI networking architecture model, as shown in FIG. 12. It establishes the physical interface and mechanisms for placing a raw stream of bits onto the wire. It defines the voltage, current, modulation, bit synchronization, connection activation and deactivation, and various electrical characteristics for the transmission media (such as unshielded or shielded twisted-pair cabling, coaxial cabling, and fiber-optic cabling). Repeaters, transceivers, network interface cards, and cabling operate at the PHY level. There are multiple protocols at the PHY layer (IEEE 802.3, RS-232C, and X.21). The TCP/IP (Transport Protocol/Internet Protocol) model combines the Physical layer with the Data Link Layer into the Network Access Layer. For the present invention, only the hardware aspects of the PHY are concerned, including the end-connectors of cables and the matching hardware ports to which the cables connect to form the interconnected infrastructure of a given network topology.

In this application, a hardware connection port is referred to an Ethernet port (also called a jack or socket) without the loss of generality as an opening on a hardware equipment that cables plug in to. The purpose of ports is to connect wired network hardware in an Ethernet local area network (LAN), metropolitan area network (MAN), or wide area network (WAN). Single Pair Ethernet (SPE) and Ethernet Advanced Physical Layer (APL) are two Ethernet innovations currently leading the way for greater expansion of Ethernet in industry. SPE is a form of Ethernet that uses a single twisted pair of wires, whereas other forms of ethernet use two or three. APL utilizes SPE combined with IEC 60079 Two-Wire Intrinsically Safe Ethernet (2-WISE) capable of being deployed with pre-existing cabling for use in hazardous environments. Examples of devices with multiple variety of Ethernet ports are presented in FIG. 13.

The present invention provides a method and system based on the method to scale with the variety of the hardware ports and provides a combined multiport connectivity, and protection of the ports from the surges associated with EMPs. The continuous demand for increase of transmission rates requires implementation of surge protection solutions that do not reduce the high-speed (broadband) communications and data transfer. The present invention provides solutions for implementing transient surge protection of high-speed (high bandwidth) channels without introducing degradation of the channel capacity. The design of the protection devices based on the present invention includes balance between the magnitude of net trace inductance and the depth of the in-band attenuation resulting from the presence of parasitic parallel capacitance. The method is used to determine the best mounting orientation for a given surge protecting component and a specific application configuration. Evaluating all parameters for the impact of the parasitic capacitance and inductance of the added components and using design technique to compensate is determining the trade-off of using high voltage/current capacity protection without limiting the transmission rate of the channel.

It is also important and advantageous to keep the traces of printed circuit board (PCB) that connect input to output port sockets straight and of equal length. This was addressed in referenced patent application Ser. No. 16/925,600 filed Jul. 10, 2020, titled Method for Detecting and Isolating an Electromagnetic Pulse for Protection of a Monitored Infrastructure. In the present invention, the need for impedance matching is addressed in order to preserve the transmission rate of the monitored and protected infrastructure.

The present invention includes a solution for transient surge protection of monitored system which must accommodate broadband application designs with the proper selection of protective components and the printed circuit board (PCB) layout design. The need to use multiple protective components requires to address their parasitic capacitance, leads inductance, and the equivalent series resistance. Pertinent electrical design parameters, such as the magnitude of the impedance, insertion loss and the parasitic elements, are considered, minimized, and compensated for all design configurations. The detailed description for each method is beyond the scope of this application. General description is provided for the impedance matching considerations.

First, the PCB traces of the protective system must be as short as practically possible. Inductance per unit length $L_L$ is based on the following relationship between the characteristic impedance of the substrate and the phase velocity and is:

$$L_L = \frac{Z_0}{V_p} = \frac{Z_0\sqrt{\varepsilon_{EFF}}}{c}$$

where $L_L$=inductance per unit length in Henrys per meter (H/m); $Z_0$=characteristic impedance in ohms; $V_P$ (phase velocity on microstrip), c=speed of light in a vacuum (inches per second); and $\varepsilon_{EFF}$=effective permittivity. For reference, the characteristic impedance ($Z_0$) of a microstrip transmission line can be calculated using the equation in FIG. 14. The PCB traces are better modeled as coplanar microstrip lines. Detail analysis is beyond the scope of this application. The use of the microstrip provides a simpler explanation of interdependences.

The characteristic impedance ($Z_0$) is a very important parameter for any transmission line. It is a function of geometry as well as materials properties, and it is a dynamic value independent of line length. It is related to the conventional distributed circuit parameters of the cable or conductors by $$Z = \sqrt{\frac{R + j\omega L}{G + j\omega C}}$$

where R is the series resistance per unit length ($\Omega$/m); L is the distributed inductance (H/m); G is the shunt conductance (℧/m); C is the shunt capacitance between the two conductors (F/m). For an ideal (lossless) line R=G=0 and Zo reduces to $\sqrt{L/C}$. Practical lines have some losses which attenuate the signal, and these are quantified as an attenuation factor for a specified length and frequency. The L and C of the line define the propagation velocity $V_p=1/\sqrt{LC}$.

The placement of the transient surge protection components introduced a lumped component localized impedance change due to the parasitic elements. Impedance changes result in wave reflections, signal distortions, and overall degradation of the transmission line (channel) transfer rate (bandwidth). The increase of the local capacitance needs to be compensated with localized increase of the inductance. Using design techniques for the PCB layout, the localized impedance changes are compensated for to prevent impedance mismatching and to preserve the broadband of the protective channel.

The main purpose of the invention is to provide protection to the monitored system (infrastructure, in general) with a broad bandwidth signal channel or digital data line without compromising the performance of the protected system. The protective system based on the present invention detects and protects the connected systems by limiting and absorbing the energy of the transient pulses before they can reach the input ports of the protected infrastructure. The present invention recognizes that the teaching of the referenced related patent applications can be extended and used to "time stamp" the occurrence of HEMP E1 detection (or other high-voltage transient pulses) and to correlate the detection to the analog signal or digital data stream. This "time stamp" of the event can be used if necessary to resolve forensic analysis of the protected system using the transmission channel.

Furthermore, the present invention recognizes that currently available in-line protection devices are single channel and introduce two additional ports and an additional cable which respectively introduces insertion losses, reflections, and overall channel degradation. Using the available single channel devices, the protection of a plurality of ports results in the addition of as many single channel protection devices and cables. For many data centers, hundreds of multiport switches are mounted in vertical racks with hundreds of connecting cables. The use of single-port (single-channel) protective device becomes a burdensome and impractical proposition.

The present invention provides a solution for protection of a plurality of ports using a multiport protection device as illustrated with the 3D computer aided design (CAD) model drawings shown from different viewing angles in FIG. 15. The device may have four, six, eight or as many integrated ports as necessary for the specific equipment configuration. The front, back, top, bottom, and two side views of the 3D CAD model are shown in FIG. 16. The invention describes multiport protection that connects directly into multiple ports of the protected equipment, as shown in FIG. 17. The drawing on the left in FIG. 17 shows an example of the front view of a 6-port protection system. The drawing on the right in FIG. 17 shows a partial top view of the multiport surge protection system with the six Ethernet plugs connectors—one for each of the six input ports. FIG. 18 displays additional features and details of the six plugs that connect the protection system directly to the equipment to be protected. As described above, this solution of the present invention eliminates one extra port connection pair (plug and receptacle) and an extra cable per each protected channel compared to the use of currently available in-line surge protection, single-channel devices. For the 6-port example presented as one possible embodiment, that means eliminating six additional cables, reducing the insertion losses while reducing the mounting space.

Additional details of the multiport protection system are discussed further in the preferred embodiment of the invention. In FIG. 19 the utility of the multiport protection device is illustrated with the design providing back-to-back assembly configuration for direct connection of plurality of multiport protection systems to the front panel of a multiport commercial switch having a set of four groups of six Ethernet ports.

SUMMARY OF THE INVENTION

Embodiments of the invention are defined by the claims below and not solely by this summary. A high-level overview of various aspects of the invention are given here for that reason, to provide an overview of the disclosure, and to introduce a selection of concepts that are further described in the Detailed Description section below. This summary is not intended to identify key features or essential features of the claimed subject matter, nor is it intended to be used as an aid in isolation to determine the scope of the claimed subject matter. In brief, this disclosure describes, among other things, a system and method for detecting, monitoring, isolating, electromagnetic pulse-induced electrical system surges induced by the E1, E2, and E3 components of an electromagnetic radiation complex multi-pulse generated by the detonation of a nuclear weapon (HEMP). The protection also extends to similar electromagnetic fields from natural and man-made sources.

In one aspect, the system and method for suppressing electromagnetic pulse-induced electrical system surges comprises a plurality of shunts placed between and in electrical communication with a plurality of power and signal lines in a system, such that common mode and differential mode voltages on the lines that exceed a predetermined level are shunted by at least one of the plurality of shunts to prevent the voltage amplitude from exceeding a predefined desired level.

In another aspect, the response time of the plurality of shunts and the allowable voltage amplitude levels 1 of the shunts are selected and combined to achieve a predefined desired response time and protection level capacity to react to and mitigate the E1, E2, and E3 components of a complex multi-pulse EMP pulse generated by detonation of a nuclear weapon at high altitude (HEMP). In a similar aspect, the response time and the voltage limiting and energy handling capacity of the plurality of shunts responds to intentional electromagnetic interference (IEMI).

In a further aspect, the system and method protect line-to-line and line-to-ground arrangements of a communication system's multiport lines, as well as combinations and subcombinations thereof.

In alternative embodiments, the system and method of the present invention are configured to protect stationary and mobile multiport devices. In further alternative embodiments, the system and method are configured for use on the electrical multiport systems of vehicles, such as automobiles, trucks, and other land, water, and air vehicles employing on-board multiport electrical systems.

In another embodiment, the system and method of the present invention are configured to protect a plurality of electronic devices associated with analog and digital communication lines typically present at data centers, command and control centers, network infrastructure, and other systems with connected input and output ports. A data center may include a multitude of electronic devices capable of receiving, switching, processing, transmitting, and storing large amounts of data which may then be accessed by authorized users using a myriad of wired and mobile electronic devices that are remote from the data center. Accessing a data center from a long distance in order to retrieve respective stored data is sometimes referred to as "cloud computing" or referring to the data as being stored "in the cloud." This includes endless online applications and data/information exchange, financial transactions and multimedia content, Internet of things, etc.

It is understood that electrical or data connections may connect data center devices with a user via the Internet and the physical layer is based on Ethernet connections or other electrical cables for data and power. More particularly, the "physical layer" consists of the electronic circuit transmission technologies of a network. It is a fundamental layer underlying the higher-level functions in a network and may be implemented through many different hardware technologies with widely varying characteristics. The connections, wiring configurations and associated additional equipment may also be referred to as power and signal/data channels, for example, power over the Ethernet (PoE) or an "upstream signal" or a "downstream signal" depending on a referenced direction of the data/signal flow. While the optical data channels are immune to the EMP effects, they also need electrical power for the distributed amplification of the optical signals. The plurality of electronic devices associated with the physical layer and the respective electronic devices connected to the Internet must be protected from the EMP effects. Therefore, the system and method according to the present invention may be configured to protect AC and DC power lines, and data lines. In an embodiment, the shunting assemblies are positioned intermediate respective to electrical and data streams. The shunting assemblies of the protection system based on the present invention continuously monitor the voltage values of PoE and data channels and are configured to shunt a detected over-voltage on the plurality of electronic devices associated with the physical layer.

It is understood that the present invention provides method and systems to protect multiple ports of the physical layer infrastructure with minimal insertion loss and without degradation of the data channels transmission rate based on characteristic impedance matching.

BRIEF DESCRIPTION OF THE DRAWINGS

Illustrative embodiments of the invention are described in detail below with reference to the attached drawing figures, and wherein:

FIG. 6 displays the analytical expressions and the numerical values for the waveform models of Early time E1, Intermediate time E2, and Late time E3;

FIG. 7 displays a table which illustrates the evolution of the waveform standards for E1 HEMP with respect to the main characteristics of the pulse's waveform model in time domain and its associated energy;

FIG. 8 is Table 2 displays details of the latest standard of the International Electrotechnical Commission for E1 HEMP waveform characteristics;

DESCRIPTION OF THE PREFERRED EMBODIMENT

The subject matter of select embodiments of the invention is described with specificity herein to meet statutory requirements. But the description itself is not intended to necessarily limit the scope of claims. Rather, the claimed subject matter might be embodied in other ways to include different components, steps, or combinations thereof similar to the ones described in this document, in conjunction with other present or future technologies. Terms should not be interpreted as implying any particular order among or between various steps herein disclosed unless and except when the order of individual steps is explicitly described. The terms "about", "approximately", or other terms of approximation as used herein denote deviations from the exact value in the form of changes or deviations that are insignificant to the function.

Before the present invention regarding detecting, isolating, and monitoring an electromagnetic pulse so as to protect a monitored infrastructure can be described in detail and in context, a deeper understanding of the characteristics of an EMP, in general, and HEMP, in particular, will be discussed in the context of traditional electrical environments and setups. Man-made generation of intentional electro-magnetic interference has frequency content within the broadband of the HEMP E1. Lightning has frequency distribution similar to HEMP E2 (FIG. 10) EMPs arising from natural phenomena, such as Geomagnetic disturbance (GMD), space weather (Solar storms, Coronal mass ejection) is also considered with respect to EM field similar to HEMP E3.

Figure 5A:
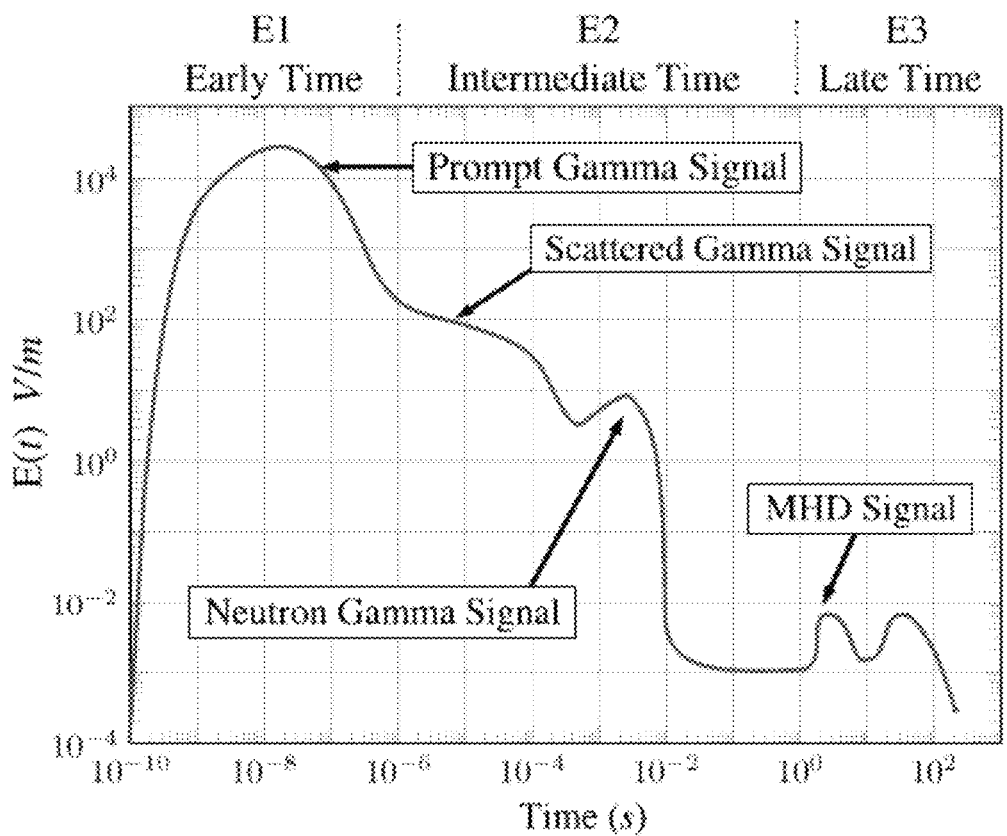
FIG. 5A displays the complexity of HEMP, which is accurately considered as a complex, electromagnetic multi-pulse event, usually described in terms of sequence of three primary components, shown separately in FIG. 5B, and defined by the International Electrotechnical Commission as E1, E2, and E3 time periods. The physical phenomena that produce the pulse waveform components are also shown.
Figure 5B:
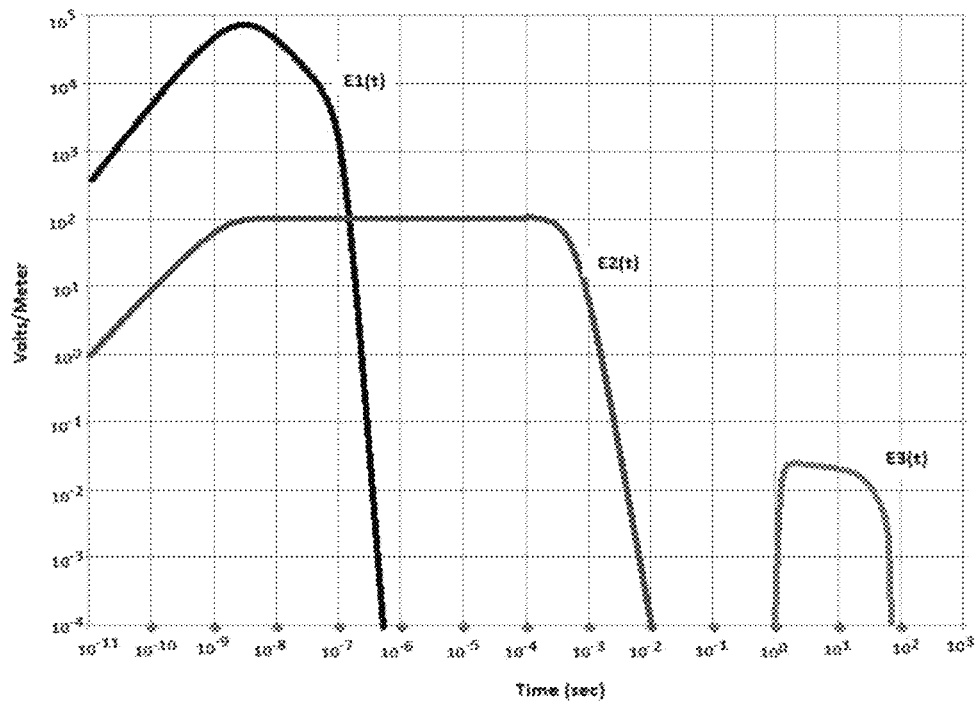
FIG. 5 presents logarithmic scale plots of the Electric field (V/m) of the EMP in time (s).

As initially presented above, an EMP generated by detonation of a nuclear weapon comprises a sequence of waveforms due to the multiple and complex interactions of the product of the nuclear blast with Earth's atmosphere and geomagnetic lines. Multiple sequential time phases (periods of varying duration) are used to describe/represent the HEMP more accurately. In this regard, the HEMP is considered a complex, electromagnetic multi-pulse, usually described in terms of three primary components defined by the International Electrotechnical Commission (IEC) as E1, E2, and E3. The three phases of the HEMP are presented in FIGS. 5A and 5B. Additional parameters and characteristics are given in FIG. 6-8. The nature of these pulses is described below.

Figure 1:
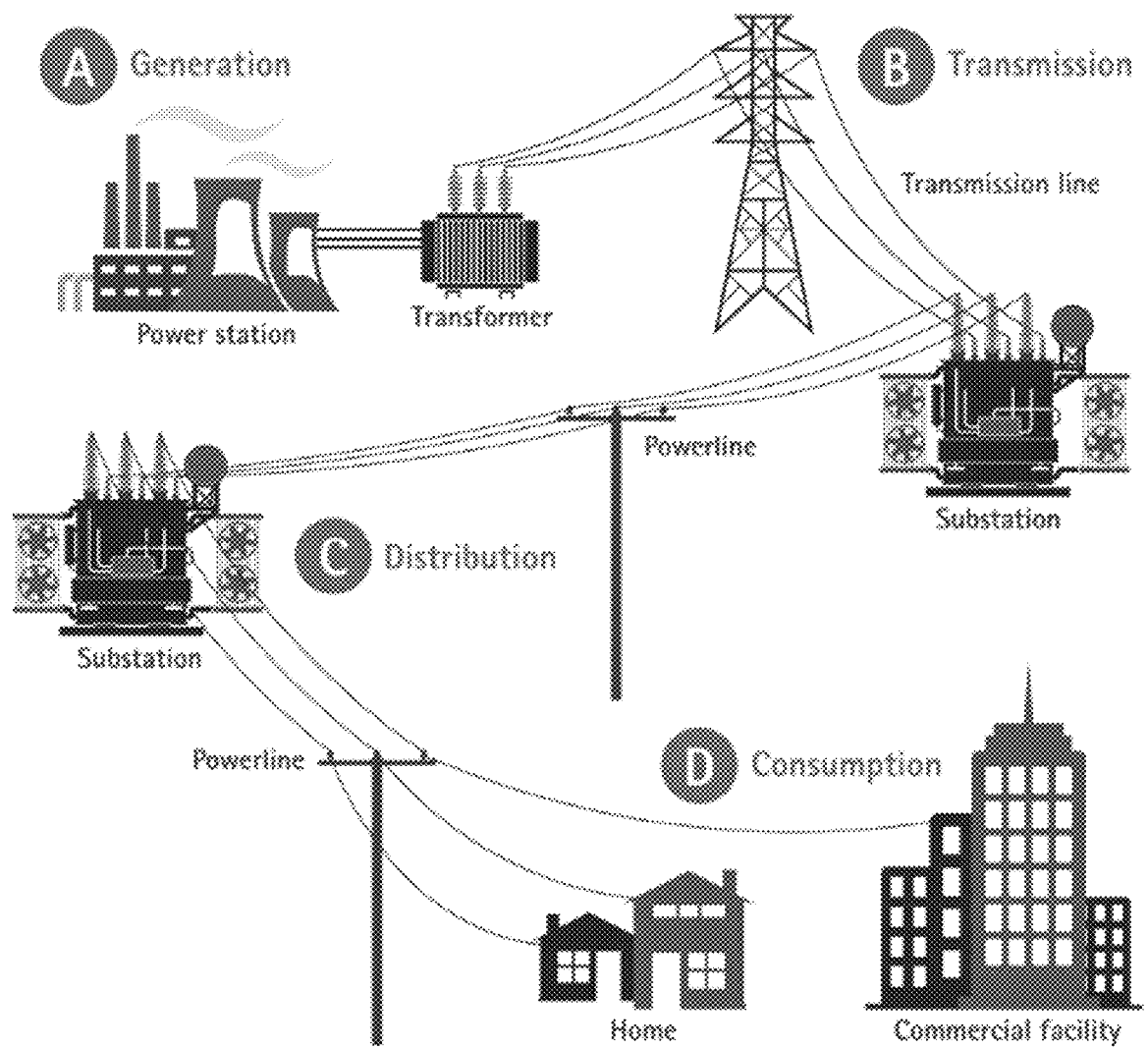
FIG. 1 is a view diagram of an electrical grid segment presenting the generation, transmission, distribution, consumption components, and system control and data acquisition networks related to the operation of the electrical grid which will be part of the infrastructure subject of protection by the present invention.
Figure 2:
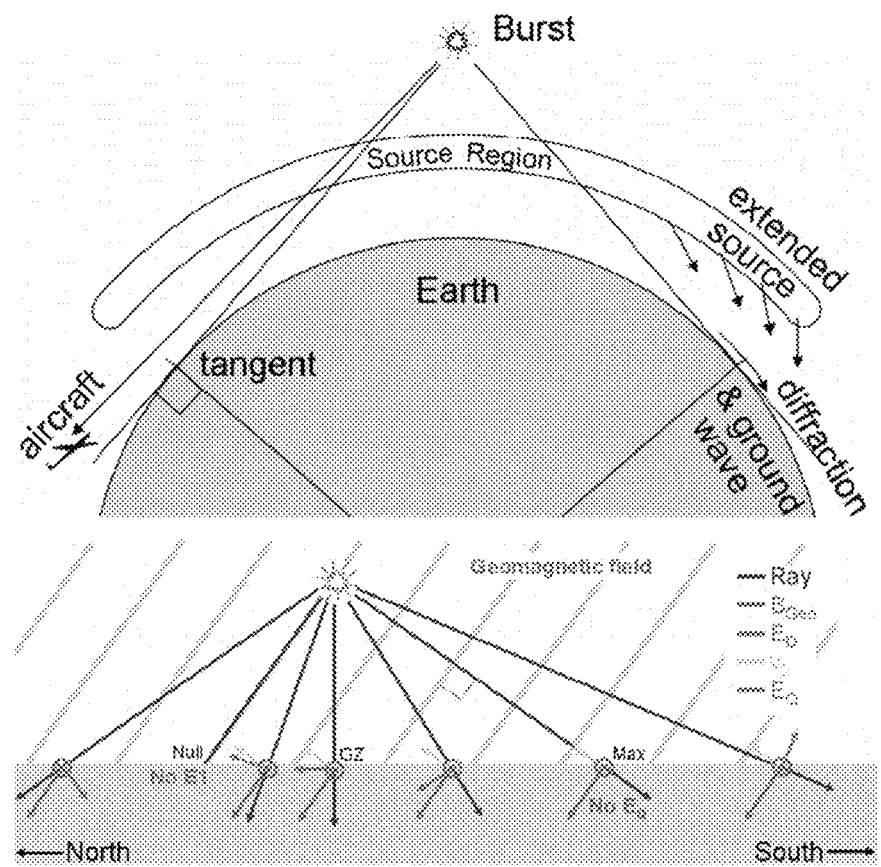
FIG. 2 is a pictograph of electromagnetic pulse generated by a high-altitude nuclear detonation, the associated gamma ray and Compton electrons producing EM field with a Poynting vector from the burst source towards the Earth's surface.
Figure 3:
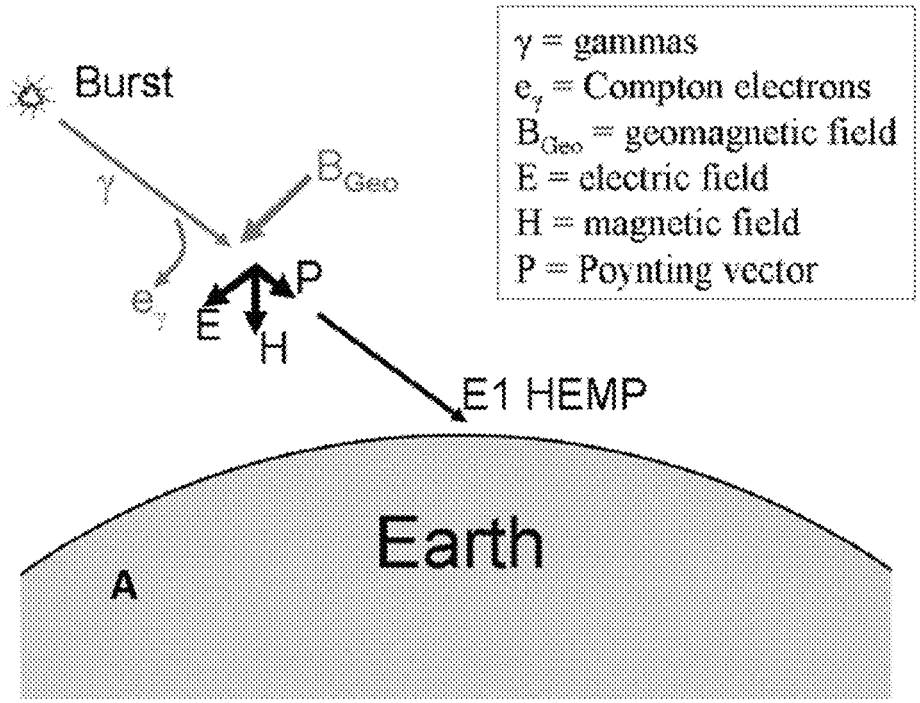
FIG. 3 is a pictograph of HEMP and the EMF Poynting vector direction with respect to observer's location on the Earth's surface, the global impact of a HEMP, and the dependence of the EMP formation and intensity on the Geomagnetic field lines orientation. The intensity of the EMP depend on the altitude of the nuclear explosion to form the Source region and on the latitude of the nuclear explosion which defines the EMP intensity with respect to the Ground zero (the point of the nuclear blast above the Earth's surface)
Figure 4:
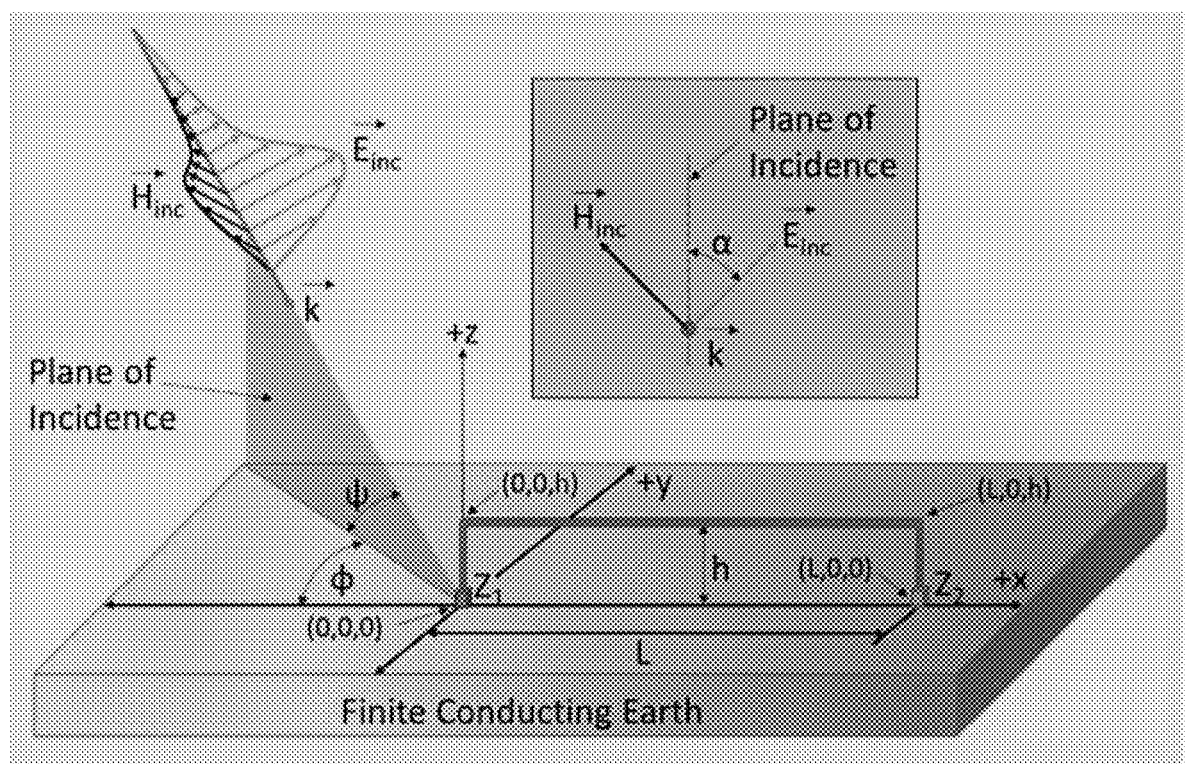
FIG. 4 illustrates the EM wave and its E (electric) and H (magnetic) vectors in the plane of incidence at a transmission wire at height h. The three associated angles ($\alpha$, $\phi$, and $\psi$) are indicative for the importance of 3D monitoring and evaluation of the Electromagnetic field (EMF)

The E1 component of the HEMP is produced when gamma radiation from the nuclear detonation knocks electrons out of the atoms in the upper atmosphere forming the so-called Source Region as shown in FIG. 2. The electrons begin to travel at relativistic speeds (i.e., at more than 90 percent of the speed of light). In the absence of a magnetic field, the displaced electrons would produce a large pulse of electric current in the upper atmosphere over the entire affected area. However, the Earth's magnetic field acts on the electrons to change the direction of electron flow so that it is at a right angle to the geomagnetic field. This interaction of the Earth's magnetic field and the downward electron flow produces a very brief, but very high magnitude, electromagnetic pulse over the affected area.

The process of gamma rays knocking electrons from the atoms in the mid-stratosphere ionizes that region, causing it to become an electrically conductive ionized layer, that limits and blocks the further expansion of the electromagnetic signals and causing the field strength to saturate at about 50,000 volts per meter (50 kV/m). The strength of the E1 HEMP depends upon the altitude of the detonation of the nuclear device and the atmosphere conditions and to the intensity of the gamma rays produced by the weapon. The 50 kV/m is a nominal peak value and varies with respect to geolocation reference to the Ground zero of the nuclear detonation (GZ in FIG. 2). The more detail explanations of the undergoing physical interactions are beyond the scope of this document and may be found elsewhere.

The interaction of the very rapidly moving negatively charged electrons with the magnetic field radiates a short duration, intense pulse of electromagnetic energy. The HEMP E1 pulse typically rises to its peak magnitude in about five nanoseconds (5 ns) and decays within hundreds of nanoseconds (200 ns-500 ns, depending on the level of intensity used for measurement). The given values may vary based on location and distant to the blast point. According to the most recent IEC standard update, the E1 pulse has a rise time of 2.5 ns±0.5 ns (from 10% to 90% amplitude levels), reaches peak value of 50 kV/m in 5 ns, and has a pulse width at half maximum of 23 ns±5 ns (FIG. 6-8, FIG. 9A).

Thus, the E1 component is a short-duration, intense electromagnetic pulse capable of inducing very high voltages in electrical conductors. That induced high voltage typically exceeds the breakdown voltage of common electrical system components such as those used in computers and communications equipment, degrading and/or destroying those components. Because the E1 component pulse occurs so quickly, most commonly available lightning surge protectors are unable to respond and suppress the surge induced into an electrical system by an E1 pulse.

The E1 component is further characterized in the certain regulatory standards. The tables in FIG. 6-8 give a better understanding for the characteristics of the E1 phase of the HEMP. There are several HEMP environment standards, and some are classified such as DoD-STD-2169. Others are public knowledge such as IEC STD 61000-2-9, MIL-STD-188-125-1, MIL-STD-461G, and MIL-STD-464C. The first HEMP related standard was created by Bell Labs in the 1960s. Since then, revisions have been made as can be seen from the table in FIG. 7. In general, the parameter values do not present geolocation variations with respect to altitude, distance, atmosphere conditions, field vectors direction, and local Earth surface properties, which impact the formation, propagation, and reflection of the EM field.

Figure 9A:
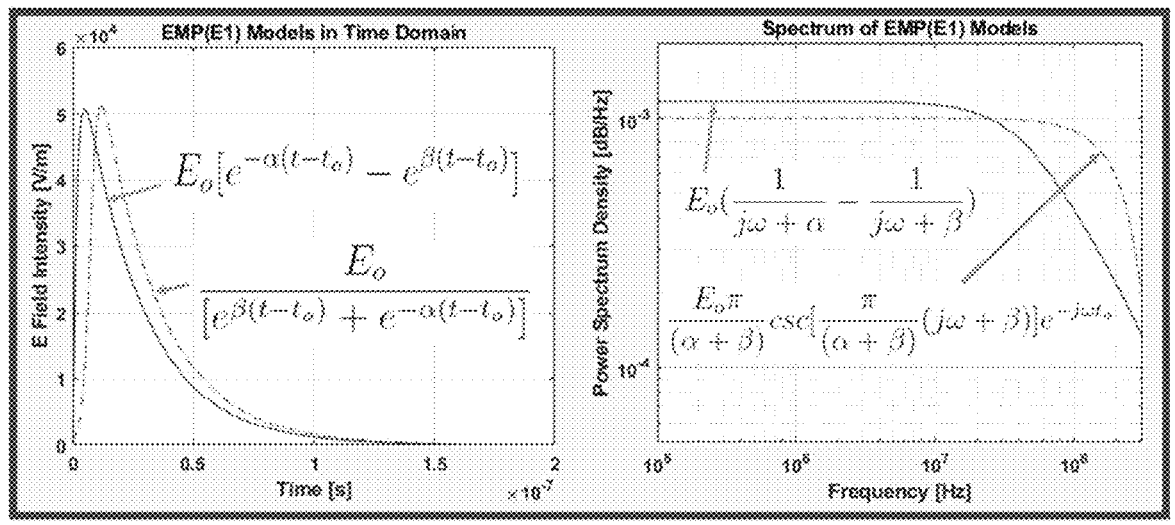
FIG. 9 displays the most common analytical expressions for HEMP E1, E2, and E3 waveforms. The Difference of double exponential (DEXP) and the Quotient of exponentials (QEXP) are the most frequently used models for HEMP E1. The waveforms in time domain and their respective spectral distribution in frequency domain are presented in FIG. 9A.
FIG. 9B displays the waveform for the Intermediate time HEMP E2.
FIG. 9C displays the two waveforms E3a and E3b associated with the Late time HEMP E3, which has two wave components based on two different physical phenomena.

Two of the well accepted and used analytical expressions of HEMP are provided in IEC 61000-2-9 and given for a reference in FIG. 9A. The combined HEMP timeline based on analytical expressions is provided in IEC 61000-2-9 and is given in FIG. 5A. Unclassified HEMP standards characterize the E1 phase of the EMP by idealized Difference of double exponentials (DEXP) and quotient exponential (QEXP) waveforms, as shown in FIG. 9A with the blue solid line and red dash-dot line, respectively. FIG. 9A displays the EMP test waveforms in time-domain (left) and their respective spectral content (right). The evolution of the E1 HEMP standards is presented in FIG. 7, where the $\alpha$ and $\beta$ are the waveform exponential constants and k is a normalizing constant for the peak amplitude at the cross section of the two exponentials. In addition to the DEXP and QEXP, two other analytical forms have been developed and presented in the literature: the P-index exponential (PEXP) and the Complimentary error function (ERFC). The main reason for these additional analytic models is some of the deficiencies of the first two models. For example, the DEXP model is discontinuous at t=0, while QEXP extends to t=∞ and has an infinite number of poles in the frequency domain. In order to rigorously explore the models, the authors of this application have developed software to interactively demonstrate and comparer the different models.

The method and devices based on the method described in this invention are based on specifications listed in the Military and Civilian Standards and are developed accordingly for protection from the effects of HEMP E1, E2, and E3 pulse components. The standards are used to test the protection system during the research and development process. The standard waveforms and the test and measurement procedures have been used during the design, implementation, and evaluation of the level of protection of the systems built for mitigate the HEMP effects.

The HEMP standards are derived by considering many possible waveforms in time and frequency domains. The mathematical models are created that best expresses the temporal and the spectral characteristics. The detection of E1 EMP is the most challenging, requiring ability to monitor the sensors' signals with sub-nanosecond resolution. The two models for the E1 EMP given in FIG. 9A have their advantages (simple analytical forms) and disadvantages: the double exponential model is discontinuous at t=0, while quotient exponential has the advantage of a continuous time derivatives for all orders but also the disadvantage of in that it extends to t=cv and has an infinite number of poles in the frequency domain. The model waveforms are useful for testing, but they do not present with high fidelity the complexity of the real HEMP E-field waveforms.

Figure 9B:
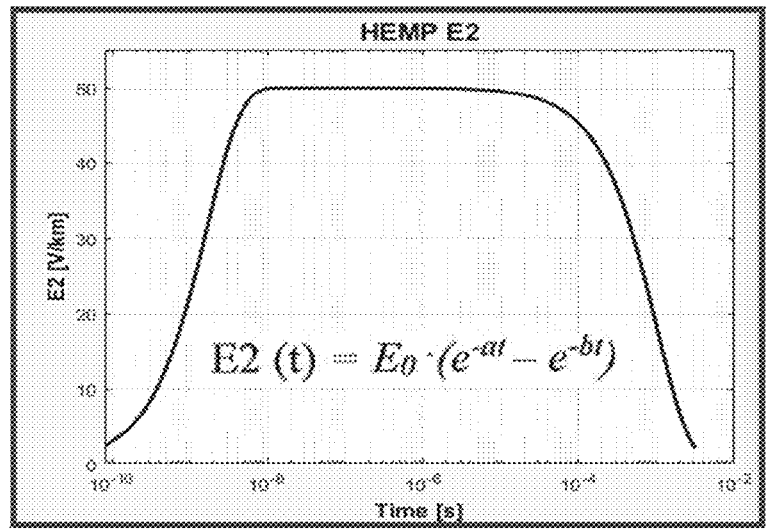

The most critical aspect regarding the E1 HEMP detection and protection is the short rise time (2.5 ns) and high peak field intensity (50 kV/m). The Initial time E1 is followed by the Intermediate time E2 and the late time E3 components of the HEMP. In this regard, an accurate detection of E1 can be confirmed with a consecutive detection of the E2 phase complex multi-pulse (generated by scattered gamma rays and inelastic gammas produced by neutrons emitted by the nuclear weapon). However, the E2 component is a pulse of intermediate time duration that, by IEC definition, lasts from about one microsecond (1 µs) to one second (1 s) after the start of the electromagnetic pulse (FIG. 9B). The E2 component of the pulse has many similarities to an electromagnetic pulse produced by lightning, although the electromagnetic pulse intensity induced by a very close-proximity lightning strike may be considerably larger than the magnitude of the E2 component of a nuclear EMP. Overall, system designed to protect from lightning will protect electrical and electronic equipment from HEMP E2.

Because of the similarities HEMP E2 to lightning-caused pulses (FIG. 10) and the widespread availability of lightning protection technology, the E2 pulse is generally considered to be the easiest to protect against. However, because an EMP produced by a nuclear weapon comprises a complex multi-pulse (i.e., the E1, E2, and E3 components), the primary potential problem with the E2 component is the fact that the E1 component before the E2 most likely has damaged any devices that were intended to protect against a lightning strike type surges but do not withstand the effects of the high slew rate (V/s) and high peak intensity (V/m) of HEMP E1. This demands the need to implement protection simultaneously against E1 and E2 of HEMP. As noted in the United States EMP Commission's Executive Report of 2004, referring to the E2 component pulse, "[i]n general, it would not be an issue for critical infrastructure systems since they have existing protective measures for defense against occasional lightning strikes. The most significant risk is synergistic, because the E2 component follows a small fraction of a second after the first component's insult, which has the ability to impair or destroy many protective and control features. The energy associated with the second component thus may be allowed to pass into and damage systems."

Figure 9C:
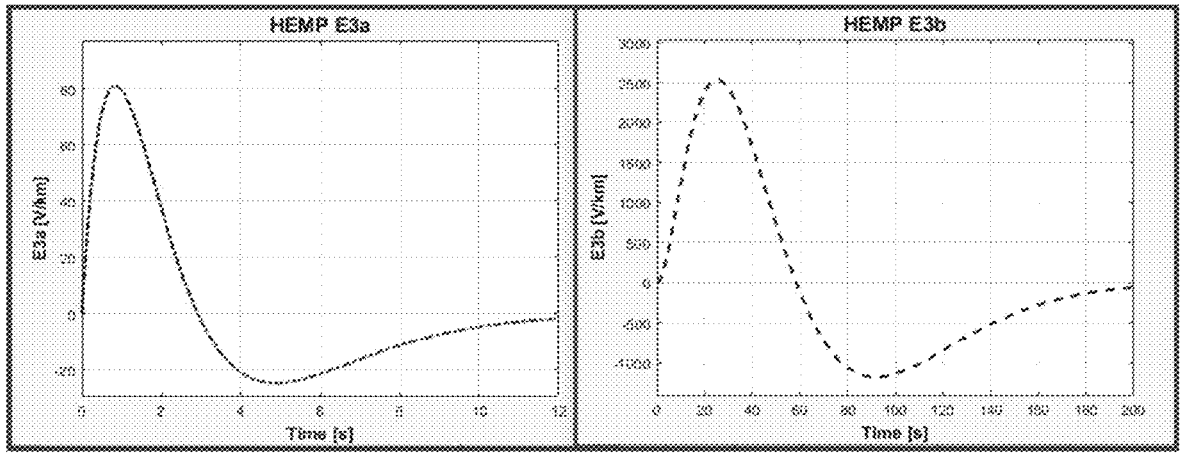

The E3 component of the complex multi-pulse is a pulse with a very long rise and fall times (long time period of oscillations) and lasts tens to hundreds of seconds. It is caused by the nuclear detonation heaving the Earth's magnetic field out of the way, followed by the restoration of the magnetic field to its natural state. The E3 component (FIG. 9C) has similarities to a geomagnetic storm caused by a very severe solar corona mass ejection (CME), or stellar-induced EMP's from stellar gamma ray burst sources, supernova, hypernova and collisions of neutron stars. Similar to a geomagnetic storm, an E3 pulse can produce geomagnetically induced currents in long electrical conductors, which can then damage or destroy components such as power line transformers. The E3 induced currents are often called quasi-DC currents because by their time domain properties they resemble extremely low frequency waveforms (ultra-long wavelengths) inducing DC-like currents into the long power transmission lines. Nearly all of the damage from E3 in modern systems occurs to the electric power grid, which is generally not designed to handle direct currents, especially in critical devices such as high voltage power transformers which are ubiquitous and essential components in AC power distribution systems (very expensive and with a long lead time for purchase).

Figure 10:
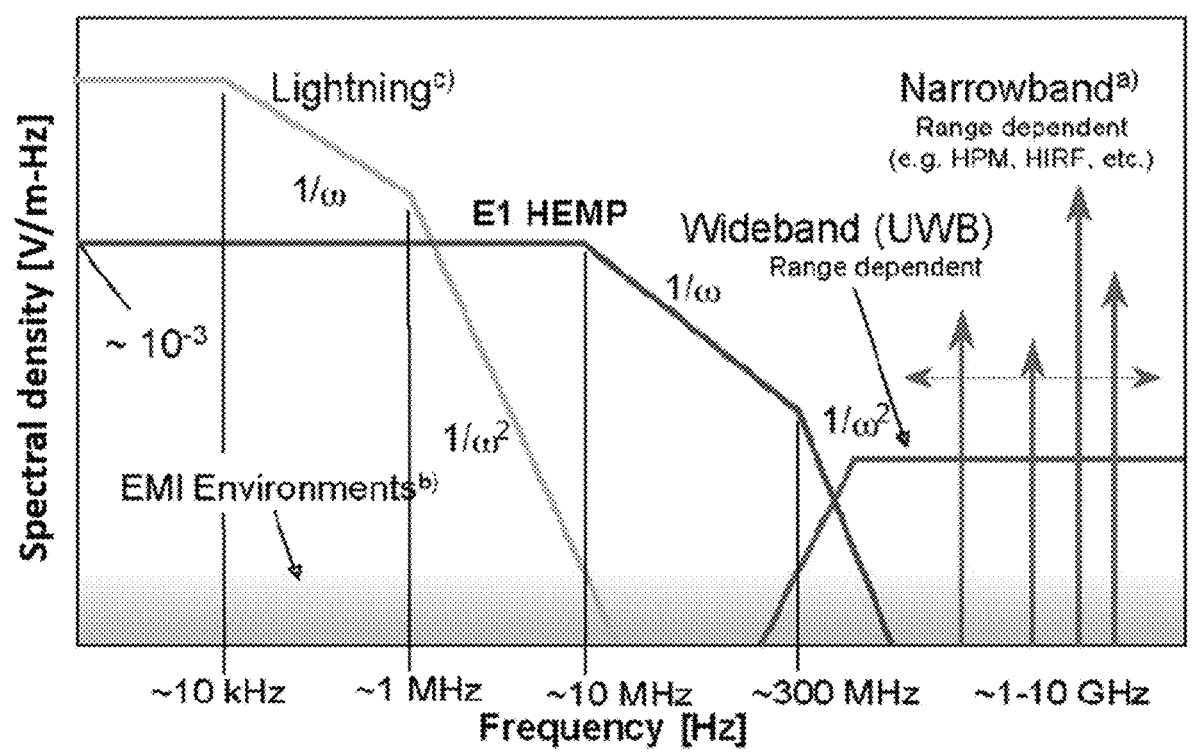
FIG. 10 is an illustration of the spectral density distribution of E1 HEMP in comparison with spectral content of lightning and man-made intentional electromagnetic interference (IEMI) of wide-band and narrow-band sources, and a high-intensity radio-frequency sources.

Looking to FIG. 10, the HEMP E1 has the broader spectral content than E2. While the HEMP E2 has similarity with lightning generated EMP, in proximity, the intensity of the field from lightning exceeds the E2 field strength. The intentional electromagnetic interference may have narrow or wideband spectrum and very different intensity levels.

Figure 11:
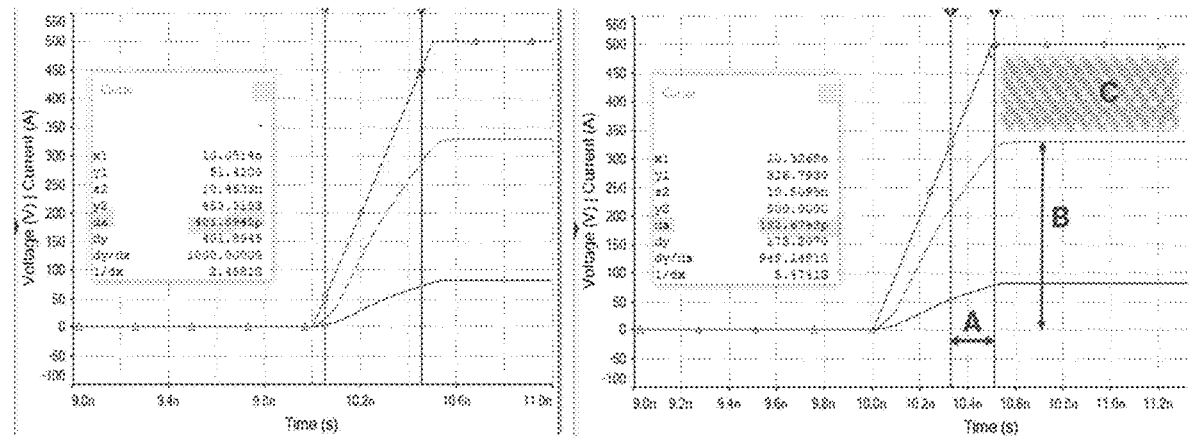
FIG. 11 is displaying simulation results of a surge-suppressing component response to a fast-rising transient voltage (left). On the right-side plot, the limited voltage level is displayed with a green color and letter B and the time for the response with letter A. Letter C is used to label the voltage difference of the input transient voltage magnitude and the voltage of the surge protection component.

Looking to FIG. 11, the switching speed of the surge protection equipment is of essence for adequate mitigation of the HEMP E1 effects. The faster the switching time, the better the protection in limiting the amount of energy (high voltage and high current) that would couple the protected device.

The current disclosure describes, among other things, a system and method for detecting and protecting electrical and electronic equipment from electromagnetic pulse-induced electrical surges by the E1, E2, and E3 components of an electromagnetic radiation complex multi-pulse generated by the detonation of a nuclear weapon (HEMP). The protection also extends to similar electromagnetic fields from natural and man-made sources.

In one aspect, the system and method for suppressing electromagnetic pulse-induced electrical system surges comprises a plurality of shunts placed between, and in electrical communication with, a plurality of power and signal lines in a system, such that common mode and differential mode voltages on the lines that exceeds a predetermined level are shunted by at least one of the plurality of shunts to prevent the voltage amplitude from exceeding a predefined desired level.

In another aspect, the response time of the plurality of shunts and the allowable voltage amplitude level of the shunts are selected and combined to achieve a predefined desired response time and protection level capacity to react to and mitigate the E1, E2, and E3 components of a complex multi-pulse EMP generated by detonation of a nuclear weapon at high altitude (HEMP). In a similar aspect, the response time and the voltage limiting and energy handling capacity of the plurality of shunts responds to intentional electromagnetic interference (IEMI).

In a further aspect, the system and method protect line-to-line and line-to-ground arrangements of a communication system's multiport lines, as well as combinations and subcombinations thereof.

In alternative embodiments, the system and method of the present invention are configured to protect stationary and mobile multiport devices. In further alternative embodiments, the system and method are configured for use on the electrical multiport systems of vehicles, such as automobiles, trucks, and other land, water, and air vehicles employing on-board multiport electrical systems.

In another embodiment, the system and method of the present invention are configured to protect a plurality of electronic devices associated with analog and digital communication lines typically present at data centers, command and control centers, network infrastructure, and other systems with connected input and output ports. A data center may include a multitude of electronic devices capable of receiving, switching, processing, transmitting, and storing large amounts of data which may then be accessed by authorized users using a myriad of wired and mobile electronic devices that are remote from the data center. Accessing a data center from a long distance in order to retrieve respective stored data is sometimes referred to as "cloud computing" or referring to the data as being stored "in the cloud." This includes endless online applications and data/information exchange, financial transactions and multimedia content, Internet of things, etc.

It is understood that electrical or data connections may connect data center devices with a user via the Internet, and the physical layer is based on Ethernet connections or other electrical cables for data and power. More particularly, the hardware "physical layer" of a network consists of the electronic circuit transmission technologies. It is a fundamental layer underlying the higher-level functions in a network and may be implemented through many different hardware technologies with widely varying characteristics. The connections, wiring configurations, and associated additional equipment may also be referred to as power and signal/data channels, for example, power over the Ethernet (PoE) or an "upstream signal" or a "downstream signal" depending on a referenced direction of the data/signal flow. While the optical data channels are immune to the EMP effects, they also need electrical power for the distributed amplification of the optical signals.

Figure 12:
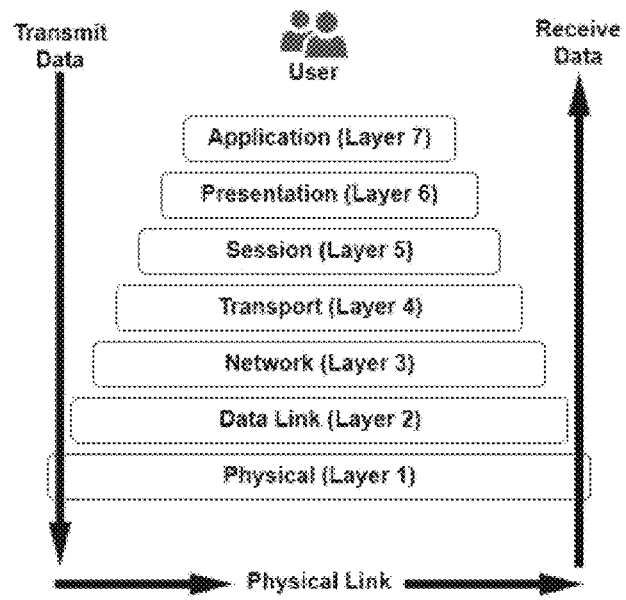
FIG. 12 is displaying the block-diagram of the Physical layer of the Open Systems Interconnection reference model, also known as the OSI Model or the Seven Layer Model. The physical layer is the bottom layer of the seven-layer OSI networking architecture model.

Looking to FIG. 12, the plurality of electronic devices associated with the physical layer and the respective electronic devices connected to the Internet forms the backbone of the Internet OSI model. All other layers depend on the robustness of the physical links of layer one and all electrical and electronic components of the physical link must be protected from the EMP effects. Therefore, the system and method according to the present invention is configurable to protect AC and DC power lines, and data lines.

In an embodiment, the shunting assemblies are positioned intermediate respective to electrical and data streams. The shunting assemblies of the protection system based on the present invention continuously monitor the voltage values of Poi and data channels and are configured to shunt a detected over-voltage on the plurality of electronic devices associated with the physical layer.

Figure 13:
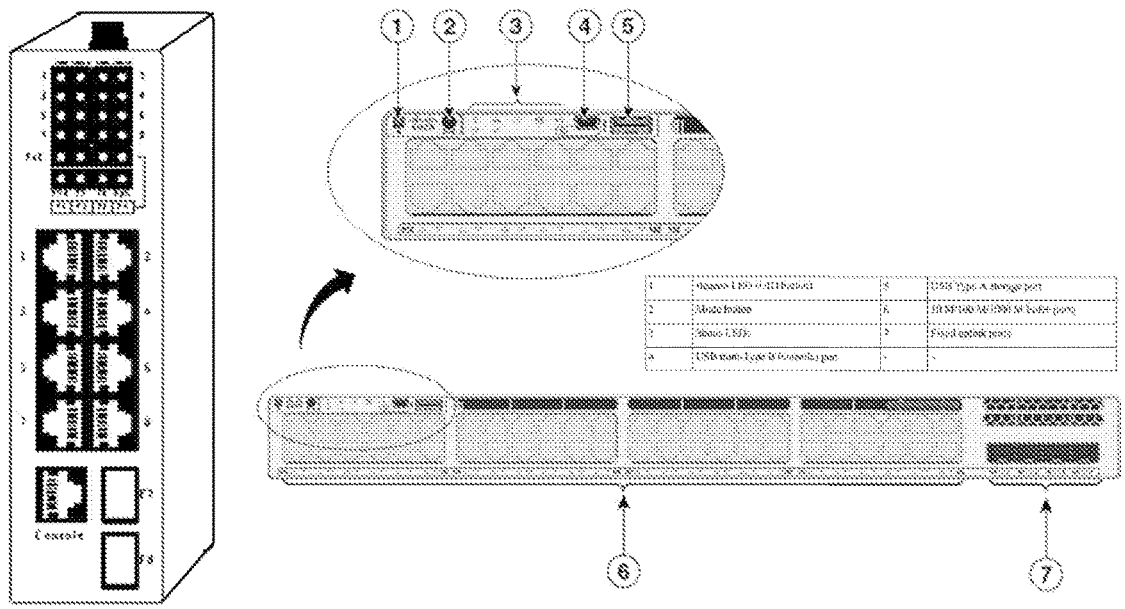
FIG. 13 is displaying examples of devices with multiple variety of Ethernet ports.

Looking to FIG. 13, it is understood that the present invention provides method and systems to protect multiple ports of the physical layer that is configurable in different and in variety of combinations. In addition, the connection of the protective system inline of the network infrastructure must be with minimal insertion loss and without degradation of the data channels transmission rate. The high transmission rates require ultrawideband channels and the multiport protection system must match the characteristic impedance of the transmission channel in order to minimize (and eliminate) distortions and reflections of the signal waveforms.

Figure 14:
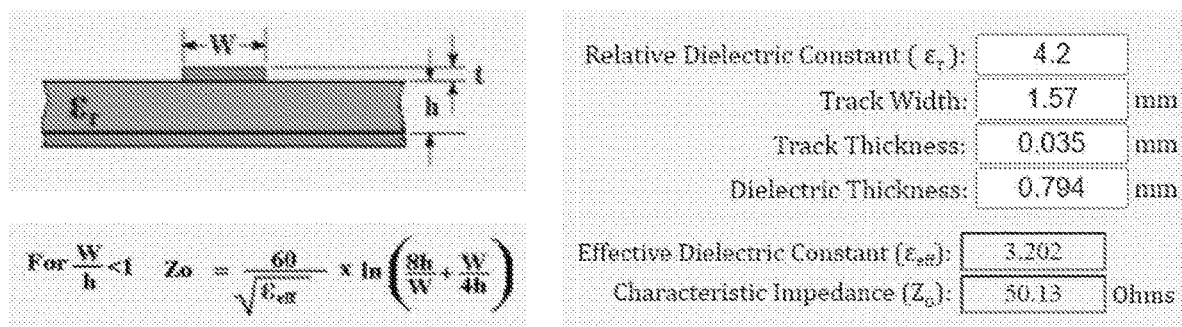
FIG. 14 is illustrating of a microstrip transmission line (top) and a coplanar microstrip line (bottom), which can be used to model the PCB traces. The relationship of dimensions and characteristic impedance are shown with one possible approach to evaluate the impact of parasitic capacitor.

Looking to FIG. 14, the characteristic impedance of a printed circuit board (PCB) transmission line depends on the configuration, physical dimensions, and material properties of the board dielectric and traces. The known analytical and modeling techniques are used to design and build protective systems with low insertion loss and matched impedance.

In general, the parasitic capacitance of the surge protection components is proportional to the current (energy) capacity of the component due to the increased cross-section. The parasitic capacitance introduces localized impedance change and lowers the transmission rate. FIG. 14 illustrates one of many design techniques to calculate, model, compensate, and balance the impedance of a PCB transmission line in order to minimize and eliminate the changes in the characteristic impedance, reflections, and insertion loss. Every specific application requires surge protection components with different parameters. Respectively, this requires the use of different techniques to balance and match the characteristic impedance.

The main purpose of the invention is to provide protection to the monitored system (infrastructure, in general) with a broad bandwidth signal channel or digital data line without compromising the performance of the protected equipment (channel). The protective system based on the present invention detects and protects the connected devices by limiting and absorbing the energy of the transient pulses before they reach the input ports of the protected infrastructure. The present invention recognizes that the teaching of the referenced related patent applications can be extended and used to "time stamp" the occurrence of HEMP E1 detection (or other high-voltage transient pulses) and to correlate the detection to the analog signal or digital data stream. This "time stamp" of the event can be used if necessary to resolve forensic analysis of the protected system using the transmission channel.

Furthermore, the present invention recognizes that currently available in-line protection devices are single channel and introduce two additional ports and an additional cable which respectively introduce insertion losses, reflections, and overall channel degradation. Using the available single channel devices, the protection of plurality of ports results in the addition of as many single channel protection devices and cables. For many datacenters, hundreds of multiport switches are mounted in vertical racks with hundreds of connecting cables. The use of single-port (single-channel) protective device becomes a burdensome and impractical proposition.

Figure 15:
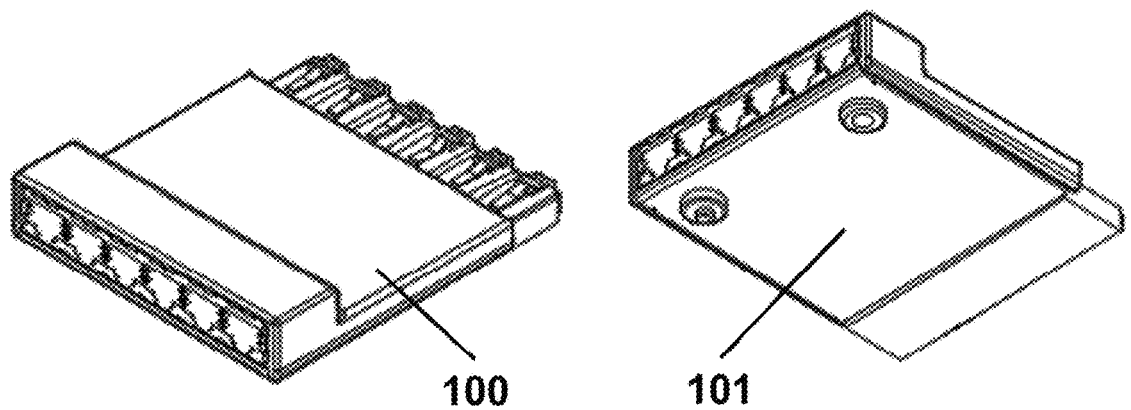
FIG. 15 is displaying a 3D CAD model drawings of an example of multiport protection device, which is illustrated shown from two different viewing angles.

Looking to FIG. 15, the displayed a 3D computer added design (CAD) model example of the preferred embodiment of multiport protection system. The top view angle 100, illustrates the assembly of six individual channel protection devices into a single casing with six Ethernet socket inputs and six Ethernet output plugs, respectively. The bottom view 101 of the multiple port assembly displays the flat planar profile of the system case which allows a close proximity back-to-back utilization of two multiport systems as illustrated further below.

The present invention provides a solution for protection of plurality of ports using a multiport protection device 100 as illustrated in FIG. 15. Without limitations, the device may have two, four, six, eight or as many integrated ports as necessary for the specific equipment configuration. Typically, even number of ports are used in practice.

Figure 16:
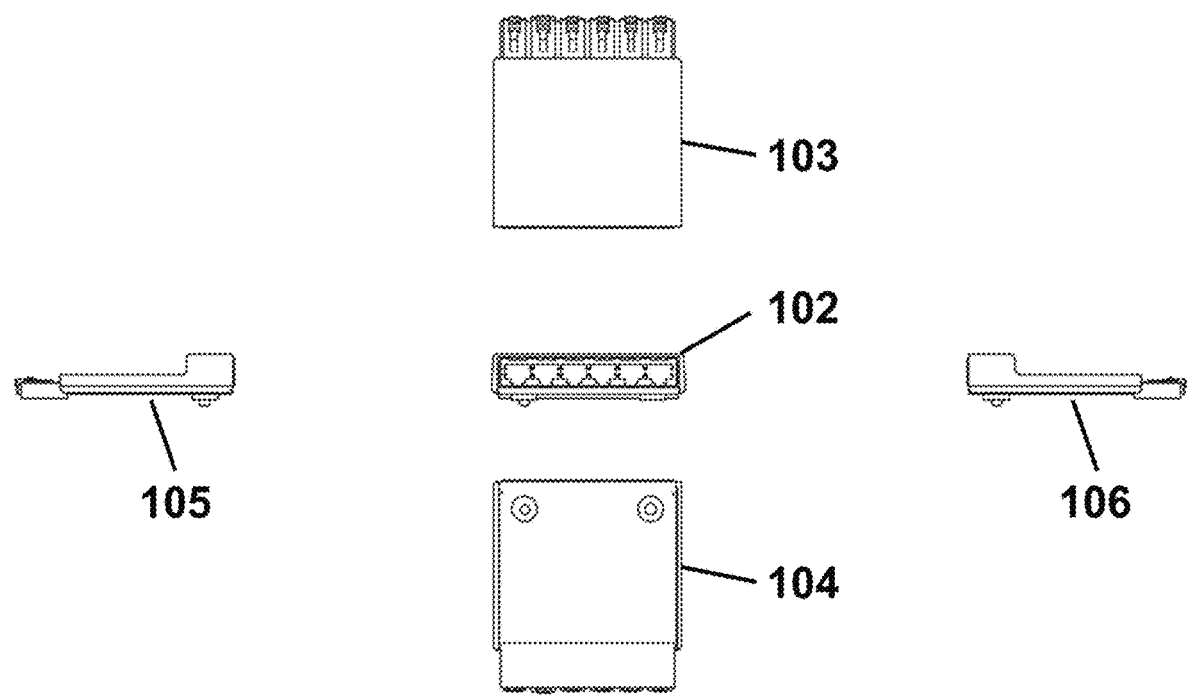
FIG. 16 is displaying the drawings of the front, back, top, bottom, and two side views of the 3D CAD model of the multiport protection device embodiment example.

Looking to FIG. 16, the front 102, top 103, bottom 104, left side 105, and right side 106 of the multiport system are displayed. The details of the input port socket connectors on the front 102 and the output port plug connectors are displayed in FIG. 17.

Figure 17:
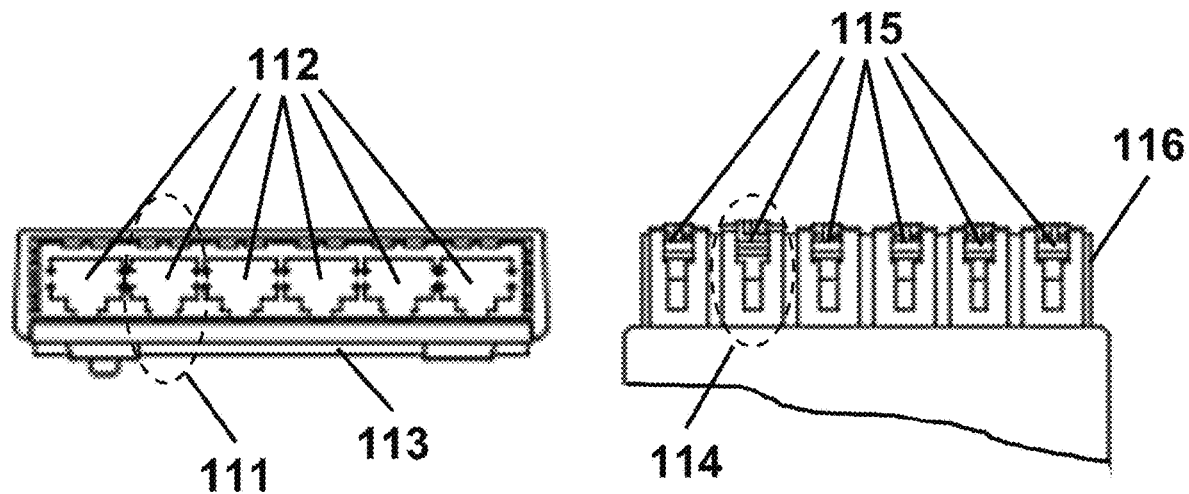
FIG. 17 is displaying of the front view (left) and a partial top view of the six Ethernet plug connectors of a 6-port protection system example.

Looking to FIG. 17, the multiport system has a group of six Ethernet port RJ45 sockets 112 in this particular example, forming the front panel 113 of the multiport system. Each individual Ethernet port socket 111 is a standard commercially available component commonly known as RG45. The Ethernet port socket 111 forms a connection pair with a matching RJ45 plug 114, as illustrated in the example in FIG. 17. Respectively, the back connecting edge of the multiport protective system has six RJ45 Ethernet plugs 115—one for each of the six Ethernet port RJ45 sockets 112 on the front panel 113 of the multiport protective system 100.

Figure 19:
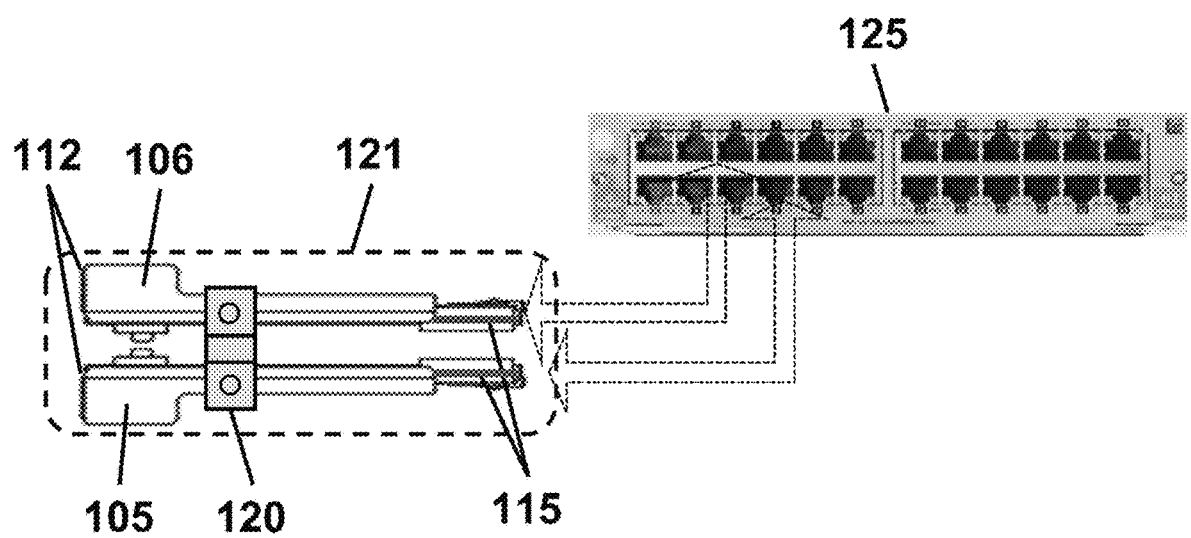
FIG. 19 is illustrating back-to-back assembly configuration of two multiport protection device for direct connection to the front panel of a commercial switch having a plurality of Ethernet ports.
Figure 20:
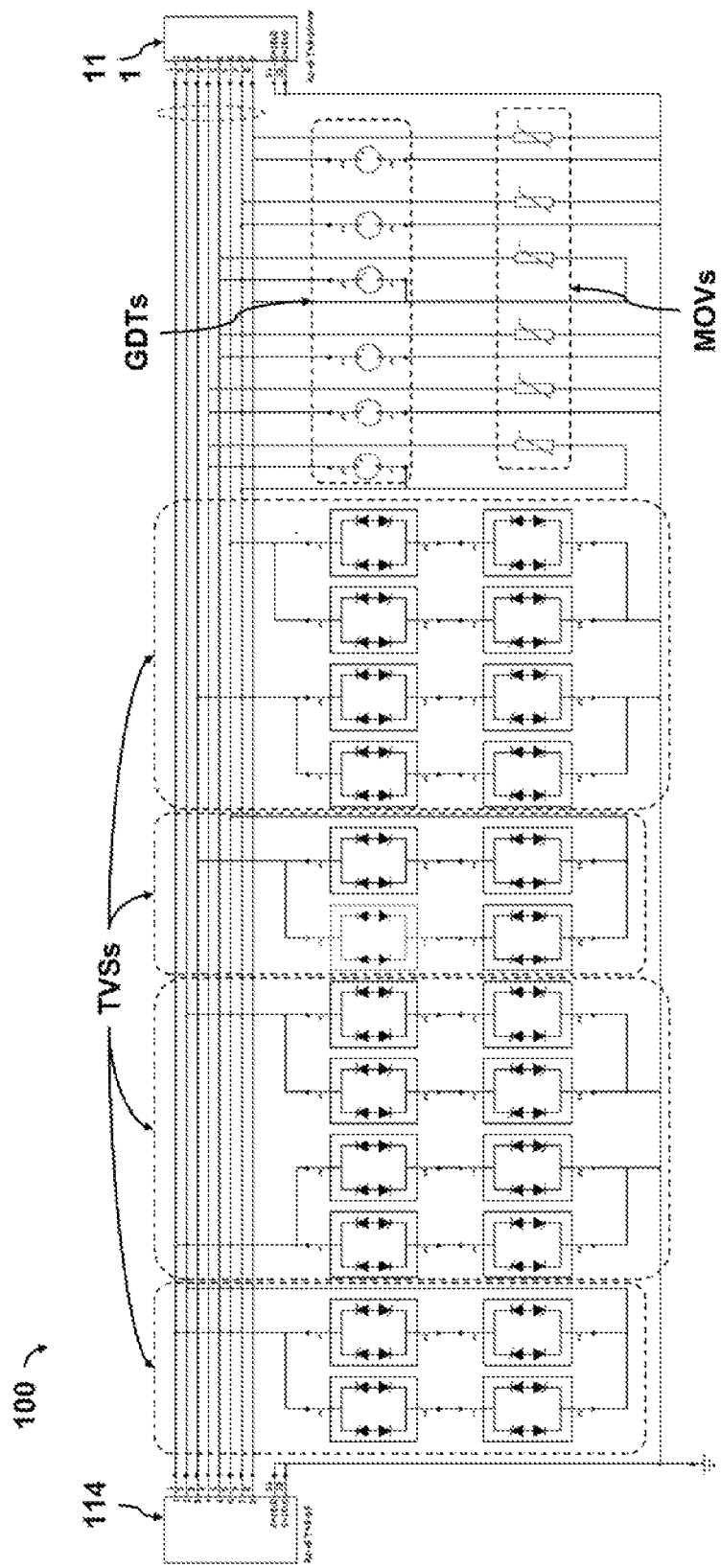
FIG. 20 illustrates an example of a transient voltage suppression system. For clarity, a single port schematic is illustrated to show the differential and common mode protection with a hybrid technology approach using TVSs, MOVs, and GDTs.

The multiport protection system 100 is directly connectable to multiport commercial devices having Ethernet ports RJ45. For the purpose of this description, the multiport protective system 100 connects to the device to be protected 125 as shown in FIG. 19. The protected device 125 in FIG. 19 is any standard or custom-made device for which the multiport protective system 100 is design and built.

The plugs 115 of the multiport protective device 100 are pressed-connected to semi-flexible edge segments 116 of the printed circuit board of the multi-port protection system providing straight line connectivity between the RJ45 plug and its corresponding RJ45 socket on the front panel. The pressed-connected mounting method eliminates the need for soldering of the pins of the plugs 115 which minimizes the changes of the impedance of the communication channels with the inline insertion of the protective system.

The invention describes multiport protection that connects directly into multiple ports of the protected equipment, as shown in FIG. 17 with six ports in this particular example. The number of ports is scalable to match the exact number of ports on the device to be protected. Without the loss of generality, the method and system of the present invention can be use with any standard commercially available port connectors or with custom made port connectors as illustrated in FIG. 13.

Figure 18:
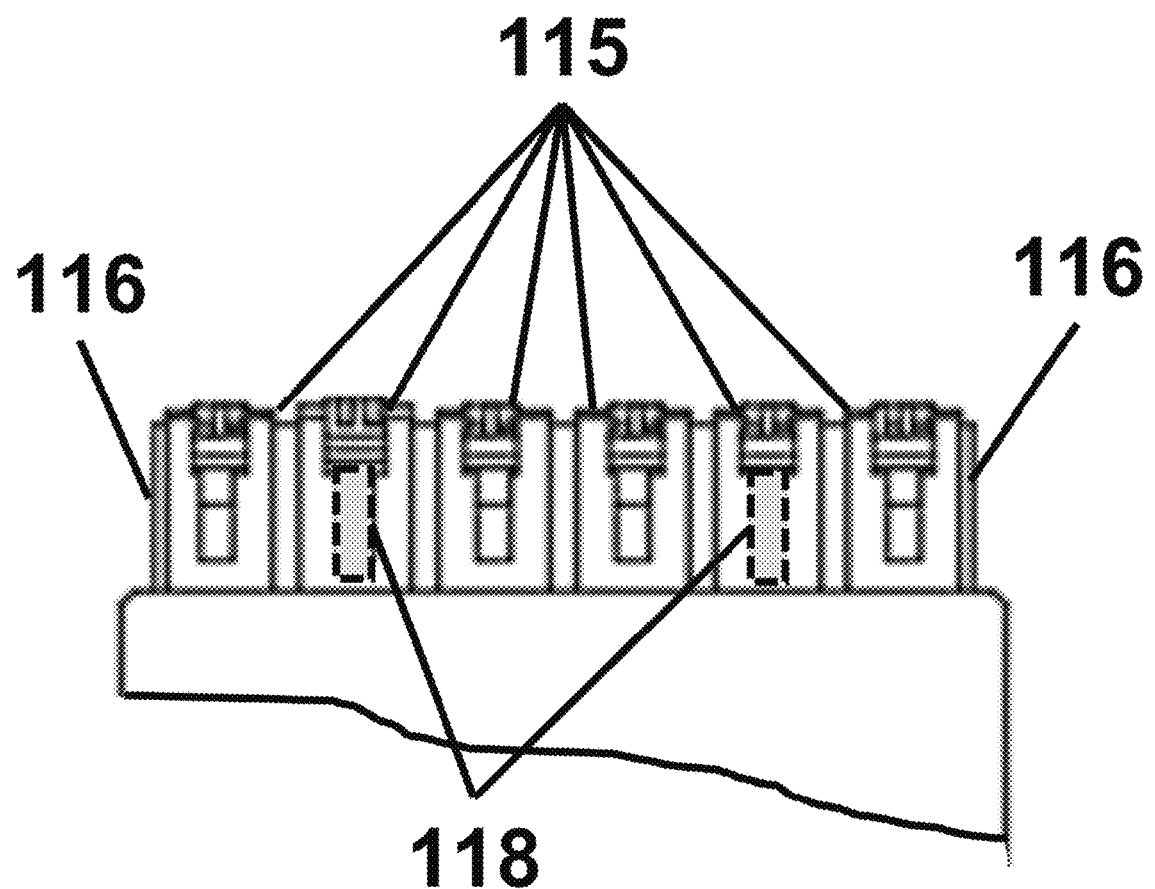
FIG. 18 is displays additional features and details of the six plugs that connect the protection system directly to the equipment to be protected.

The drawing on the right in FIG. 17 shows a partial top view of the multiport transient surge protection system with the six Ethernet plug connectors—one for each of the six input ports. FIG. 18 displays additional features and details of the six plugs that connect the protection system directly to the equipment to be protected. As described above, this solution of the present invention eliminates one extra port connection pair (plug and receptacle) and an extra cable per each protected channel compared to the use of currently available in-line surge protection, single-channel devices. For the 6-port example presented as one possible embodiment, that means eliminating six additional cables, reducing the insertion losses while reducing the mounting space.

Looking to FIG. 18, the multi-port protection system 100 provides conductive connections 116 for the shielding of the network connecting cables to the chassis ground of a said multiport commercial device and a set of interlocking mechanisms 118 for the RJ45 Ethernet ports.

Looking to FIG. 19, the method and system utility of the multiport protection device is illustrated with the side views 105 and 106 of two multiport protection systems 100 configured in back-to-back assembly 121 for direct connection to the front panel of a multiport commercial switch 125 using the RJ45 port plugs 114 assembled in a multiplug configuration 115 which are shown previously in FIG. 18. The assembly 121 is shown with the side views 105 and 106 (first shown in FIG. 16). The assembly 121 of two back-to-back multiport protection systems 100 is additionally secured with mechanical brackets 120 for connecting to the multiport commercial devices directly connectable to a multiport commercial device 125. The arrows in FIG. 19 with dashed contour lines illustrate the connect/disconnect pathway for the connection of the assembly 121 of two multiport system 100. The RJ45 plugs 115 of the multiport protection systems 100 are inserted into the front panel RJ45 sockets of device to be protected 125, The network cables then connect to the RJ45 sockets 112 of the multiport protection systems 100.

In some specific applications, one of the ports 112 in FIG. 17 of the multiport protection system 100, is used for communicating information for the status of the multiport protection system 100 when equipped with self-monitoring embedded logic for a E1, E2, and E3 event detection notification. The multiport protection system 100 transmit a time stamp of the detected event to which surge suppressors react. The information is used for notification about the occurrence of a surge event, quality monitoring of the channel associated with the event and, when necessary, forensic analysis of the protective system 100 and the protected electronic equipment 125.

What is claimed is:

1. A method for suppressing an electrical surge induced by an electromagnetic pulse ("EMP") generated by a nuclear weapon detonation from reaching a plurality of electronic devices associated with communication channels, said method comprising:
    shunting by a first shunting assembly a first overvoltage exceeding a first E1 predetermined threshold level by an E1 component pulse induced in a signal stream channel connected to a plurality of electronic device ports associated with a network to limit a level of said first overvoltage to a second E1 predetermined threshold level, said shunting occurring within less than one nanosecond after receiving the first overvoltage,
    wherein said first shunting assembly including transient voltage suppressors (TVSs), metal oxide varistors (MOVs), gas discharge tubes (GDTs), other mechanical, electrical and ionization discharge devices (IDDs) and combinations thereof of surge limiting technologies;
    shunting by a second shunting assembly a second overvoltage exceeding a first E2 predetermined threshold level by an E2 component pulse induced in a signal stream channel connected to a plurality of electronic device ports associated with a network to limit a level of said second overvoltage to a second E2 predetermined threshold level,
    wherein said second shunting assembly including transient voltage suppressors (TVSs), metal oxide varistors (MOVs), gas discharge tubes (GDTs}, other mechanical, electrical and ionization discharge devices (IDDs) and combinations thereof of surge limiting technologies; and
    shunting by a third shunting assembly a third overvoltage exceeding a first E3 predetermined threshold level by an E3 component pulse induced in a signal stream channel connected to a plurality of electronic device ports associated with a network to limit a level of said third overvoltage to a second predetermined threshold level,
    wherein the said third shunting assembly including transient voltage suppressors (TVSs), metal oxide varisiors (MOVs), gas discharge tubes (GDTs), other mechanical, electrical and ionization discharge devices (IDDs) and combinations thereof of surge limiting technologies.

2. The method for suppressing an electrical surge as in claim 1, further comprising electrically interfacing said first, second, and third shunting assemblies intermediate the signal stream channel and the plurality of electronic devices associated with the network.

3. The method for suppressing an electrical surge as in claim 1, wherein said shunting of first, second, and third over-voltages, respectively, does not cause operational degradation to said first, second, and third shunting assemblies, respectively.

4. The method for suppressing an electrical surge as in claim 1, further comprising mounting respective shunting assemblies in a casing that is in hardware connection to multiple of said plurality of electronic device ports associated with the network.

5. The method for suppressing an electrical surge as in claim 1, wherein said first, second, and third shunting assemblies include a hardware connection to said electronic device ports so as to shunt against high voltage transients induced by intentional electromagnetic interference not associated with an EMP from a nuclear detonation.

6. The method for suppressing an electrical surge as in claim 1, wherein each of said first, second, and third shunting assemblies includes a plurality of shunting devices taken from a group including TVSs, MOVs, GDTs, other mechanical, electrical and IDDs, and combinations thereof.

7. The method for suppressing an electrical surge as in claim 6, wherein said first, second, and third shunting assemblies have varied response times and voltage levels, respectively, and are operable to react to one of said E1, E2, and E3 component pulses, respectively.

8. The method for suppressing an electrical surge as in claim 1, wherein said first shunting assembly, said second shunting assembly, and said third shunting assembly are mounted in a casing operable for simultaneous direct hardware connection to the plurality of electronic devices associated with the communication channels.

9. The method for suppressing an electrical surge as in claim 1, wherein said first, second, and third shunting assemblies are electrically connected to a multi-port protection system having a plurality of integrated input and output ports to directly connect to said plurality of electronic device ports associated with the network.

10. The surge suppression system as in claim 9, wherein said multi-port protection system is capable of direct connection to a multiport commercial switch having a set of Ethernet ports assembled in groups and multiple of said groups mounted on a switch panel.

11. A surge suppression system for suppressing an electrical surge induced by an intentional electromagnetic interference and a natural space weather electromagnetic pulse from reaching a plurality of electronic device ports associated with a plurality of network communication channels, respectively, wherein each electronic device has a signal input port, said surge suppression system comprising:
    a first shunting assembly that includes TVSs, MOVs, GDTs, other mechanical, electrical and IDDs and combinations thereof that is operable to shunt a first overvoltage exceeding a first E1 predetermined threshold level by an E1 component pulse induced in a signal stream upstream of the plurality of electronic device ports associated with the plurality of network communication channels so as to decrease a level of said first overvoltage to a second E1 predetermined threshold level within less than one nanosecond after receiving said first overvoltage;
    wherein said first shunting assembly is electrically connected to a high frequency broadband multiport protection system and is operable for simultaneous direct hardware connection to multiple of the plurality of electronic device ports associated with the plurality of network communication channels such that impedance of said network communication channels is matched, insertion and reflection losses of said network communication channels are eliminated, and bandwidth and throughput of said network communication channels are preserved.

12. The surge suppression system as in claim 11, further comprising:
    a second shunting assembly including TVSs, MOVs, GDTs, other mechanical, electrical and IDDs and combinations thereof that is operable to shunt a second overvoltage exceeding a first E2 predetermined threshold level by an E2 component pulse induced in a signal stream upstream of the plurality of electronic devices associated with the plurality of network communication channels to decrease the level of said second overvoltage to a second E2 predetermined threshold level; and
    a third shunting assembly including TVSs, MOVs, GDTs, other mechanical, electrical and IDDs and combinations thereof that is operable to shunt a third overvoltage exceeding a first E3 predetermined threshold level by an E3 component pulse induced in a signal stream upstream of the plurality of electronic devices associated with the plurality of network communication channels to decrease the level of said third overvoltage to a second E3 predetermined threshold level.

13. The surge suppression system as in claim 12, wherein:
said second shunting assembly is operable to shunt said second over-voltage within less than one microsecond after detection of said third overvoltage; and
said third shunting assembly is operable to shunt said third over-voltage within less than one second after detection of said third overvoltage.

14. The surge suppression system as in claim 13, wherein said second shunting assembly and said third shunting assembly are electrically connected to said multiport protection system and operable for simultaneous direct hardware connection to multiple of the plurality of electronic devices associated with the plurality of network communication channels.

15. The surge suppression system as in claim 12, wherein said first shunting assembly, said second shunting assembly, and said third shunting assembly are positioned intermediate said signal stream and said plurality of said electronic devices associated with the plurality of network communication channels.

16. The surge suppression system as in claim 12, wherein said first shunting assembly, said second shunting assembly, and said third shunting assembly are simultaneously connected in line with said signal stream and said plurality of said electronic devices associated with the plurality of network communication channels.

17. The surge suppression system as in claim 12, wherein said first shunting assembly, said second shunting assembly, and said third shunting assembly are operable to react to a timing of the E1, E2, and E3 component pulses, respectively.

18. The surge suppression system as in claim 12, wherein said first shunting assembly, said second shunting assembly, and said third shunting assembly are operable to shunt said first, second, and third over-voltages, respectively, with minimal interference and degradation to any other shunting assembly.

19. The surge suppression system as in claim 12, wherein each of said first, second, and third shunting assemblies includes a plurality of shunting devices taken from a group including TVSs, MOVs, GDTs, other mechanical, electrical and IDDs and ionization discharge devices and combinations thereof.

20. The surge suppression system as in claim 12, wherein said first, second, and third shunting assemblies have varied reaction times and voltages, respectively, and are operable to react to one of said E1, E2, and E3 component pulses, respectively.

21. The surge suppression system as in claim 12, wherein said first, second, and third shunting assemblies are electrically connected to a printed circuit board of said multiport protection system so as to form transmission lines having an impedance that matches an impedance of said plurality of network communication channels and that preserve a transmission rate of said plurality of communication channels after connecting to said multi-port protection system.

22. The surge suppression system as in claim 12, wherein said sensing of said E1, E2, and E3 component pulses by said first, second, and third shunting assemblies, respectively, is used to record a time stamp associated with said transient suppression and shunting event and is used for notification about an occurrence of said transient suppression and shunting event, quality monitoring of the plurality of network communication channels associated with the multiport protective system and forensic analysis of the plurality of electronic device ports.

23. The surge suppression system as in claim 14, wherein said multiport protection system includes a plurality of integrated ports directly connected to said plurality of electronic device ports associated with said plurality of network communication channels, respectively.

24. The surge suppression system as in claim 11, wherein said multiport protection system is directly connectable to a multiport commercial device having a set of Ethernet ports assembled in groups and multiple of said groups mounted on multiple rows on a panel of the multiport commercial device.

25. The surge suppression system as in claim 11, wherein said multiport protection system is directly connectable to a multiport commercial device so as to eliminate a requirement for having output Ethernet ports sockets on the multiport protection system and additional connecting cables to said plurality of electronic device ports.

26. The surge suppression system as in claim 11, wherein said multiport protection system is directly connectable to a multiport commercial device so as to eliminate having additional Ethernet port socket-plug pair connections on the plurality of network communication channels and lowering an insertion loss of the multi-port protection system.

27. The surge suppression system as in claim 11, wherein said multiport protection system is directly connectable to a multiport commercial device and wherein said multiport protection system provides conductive connections for a shielding of network connecting cables to a chassis ground of said multiport commercial device.

28. The surge suppression system as in claim 11, wherein said multiport protection system is directly connectable to a multiport commercial device and wherein said multiport protection system provides interlocking Ethernet plugs and a secure mechanical bracket for connecting to said multiport commercial device.

29. The surge suppression system as in claim 11, wherein said multiport protection system is directly connectable to a multiport commercial device having Ethernet port plugs press-connected to semi-flexible edge segments of the printed circuit board of the said multiport protection system providing straight line connectivity to contact pins of each said Ethernet port plug, respectively, for eliminating soldering of the pins of said each Ethernet port plug, respectively, and minimizing changes of an impedance of the plurality of communication channels.

30. The surge suppression system as in claim 11, wherein said multiport protection system is directly connectable to a multiport device and wherein said multiport device has different types of commercial and custom-made ports respectively matched with the input and output connectors of said multi-port protection system.

* * * * *